United States Patent
Girard et al.

(10) Patent No.: US 7,191,512 B2
(45) Date of Patent: Mar. 20, 2007

(54) TRAY SYSTEM FOR HOLDING AND POSITIONING COMPONENTS

(75) Inventors: Mark T. Girard, South Haven, MN (US); Ryan A. Jurgenson, Hutchinson, MN (US); Roger R. Livermore, deceased, late of Hutchinson, MN (US); by Susan June Livermore, legal representative, Hutchinson, MN (US); David R. Swift, Glencoe, MN (US); Joseph P. Tracy, South Haven, MN (US)

(73) Assignee: Applied Kinetics, Inc., Hutchinson, MN (US)

( * ) Notice: Subject to any disclaimer, the term of this patent is extended or adjusted under 35 U.S.C. 154(b) by 770 days.

(21) Appl. No.: 10/073,620

(22) Filed: Feb. 11, 2002

(65) Prior Publication Data

US 2002/0069518 A1    Jun. 13, 2002

Related U.S. Application Data

(63) Continuation of application No. 09/409,010, filed on Sep. 29, 1999, now abandoned, which is a continuation of application No. 09/250,823, filed on Feb. 17, 1999, now Pat. No. 6,266,869.

(60) Provisional application No. 60/102,216, filed on Sep. 29, 1998, provisional application No. 60/102,860, filed on Oct. 2, 1998.

(51) Int. Cl.
*B23P 19/00* (2006.01)

(52) U.S. Cl. .............................. 29/759; 29/721; 29/742; 29/760; 29/603.03; 206/725; 206/564; 206/722; 360/244.2

(58) Field of Classification Search ................ 29/729, 29/739, 740–743, 759, 603.01; 414/705; 206/716–726, 561–565
See application file for complete search history.

(56) References Cited

U.S. PATENT DOCUMENTS

| 4,619,363 A | * | 10/1986 | Wolfseder ................. 206/373 |
| 4,866,836 A | | 9/1989 | Von Brandt et al. |
| 4,980,783 A | | 12/1990 | Moir et al. |
| 5,155,904 A | | 10/1992 | Majd |
| 5,172,468 A | | 12/1992 | Tanaka et al. |
| 5,198,945 A | | 3/1993 | Blaeser et al. |

(Continued)

FOREIGN PATENT DOCUMENTS

JP        3-47940        2/1991

(Continued)

*Primary Examiner*—Minh Trinh
(74) *Attorney, Agent, or Firm*—Kagan Binder, PLLC

(57) ABSTRACT

The present invention provides a tray for holding components having first and second sides, wherein the first side has at least one first component receptacle for engaging said component; and the second side has at least one component engaging member, and further wherein the first component receptacle and the component engaging member are aligned such that when multiples of the tray are stacked upon each other the first component receptacle and the component engaging member will cooperate to restrain the motion of the component relative to the tray. In such an embodiment the component will have first and second engagement surfaces and the first component receptacle will engage the first component engagement surface and the component engaging member will engage the second component engagement surface.

11 Claims, 29 Drawing Sheets

U.S. PATENT DOCUMENTS

| | | | |
|---|---|---|---|
| 5,198,948 A | 3/1993 | Stover et al. | |
| 5,203,452 A * | 4/1993 | Small et al. | 206/725 |
| 5,249,356 A | 10/1993 | Okuda et al. | |
| 5,282,102 A | 1/1994 | Christianson | |
| 5,371,939 A | 12/1994 | Ressmeyer et al. | |
| 5,383,270 A | 1/1995 | Iwatsuka et al. | |
| 5,391,842 A | 2/1995 | Bennin et al. | |
| 5,400,904 A * | 3/1995 | Maston et al. | 206/725 |
| 5,418,692 A * | 5/1995 | Nemoto | 361/809 |
| 5,473,488 A | 12/1995 | Gustafson et al. | |
| 5,491,597 A | 2/1996 | Bennin et al. | |
| 5,547,082 A * | 8/1996 | Royer et al. | 206/725 |
| 5,608,590 A | 3/1997 | Ziegler et al. | |
| 5,636,089 A | 6/1997 | Jurgenson et al. | |
| 5,645,735 A | 7/1997 | Bennin et al. | |
| 5,661,619 A | 8/1997 | Goss | |
| 5,682,780 A | 11/1997 | Girard | |
| 5,729,889 A | 3/1998 | Goss | |
| 5,812,344 A | 9/1998 | Balakrishnan | |
| 5,848,702 A * | 12/1998 | Pakeriasamy | 206/725 |
| 5,859,749 A | 1/1999 | Zarouri et al. | |
| 5,865,978 A | 2/1999 | Cohen | |
| 5,877,920 A | 3/1999 | Resh | |
| 5,894,657 A | 4/1999 | Kanayama et al. | |
| 5,912,787 A | 6/1999 | Khan et al. | |
| 5,918,362 A | 7/1999 | Yamashita et al. | |
| 5,957,293 A * | 9/1999 | Pakeriasamy | 206/725 |
| 6,002,650 A | 12/1999 | Kuribayaski et al. | |
| 6,020,022 A | 2/2000 | Ejiri et al. | |
| 6,071,056 A | 6/2000 | Hollowell | |
| 6,079,565 A * | 6/2000 | Walsh et al. | 206/725 |
| 6,109,445 A * | 8/2000 | Beyer | 206/714 |
| 6,130,863 A | 10/2000 | Wang et al. | |
| 6,146,813 A | 11/2000 | Girard et al. | |
| 6,266,869 B1 | 7/2001 | Tracy et al. | |
| 6,357,595 B2 * | 3/2002 | Sembonmatsu et al. | 206/726 |

FOREIGN PATENT DOCUMENTS

| | | |
|---|---|---|
| WO | WO 01/23133 | 4/2001 |
| WO | WO 01/71437 | 9/2001 |

* cited by examiner

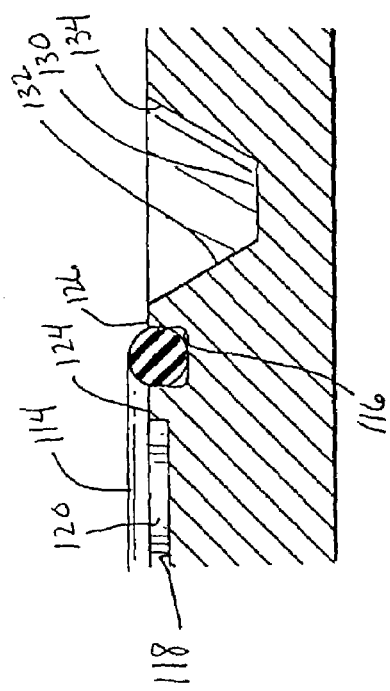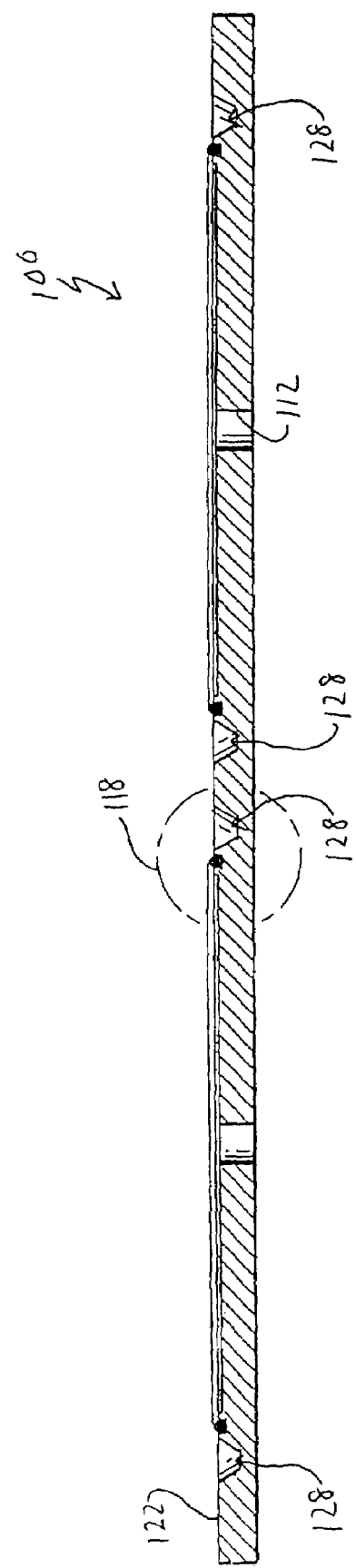

FIG. 8
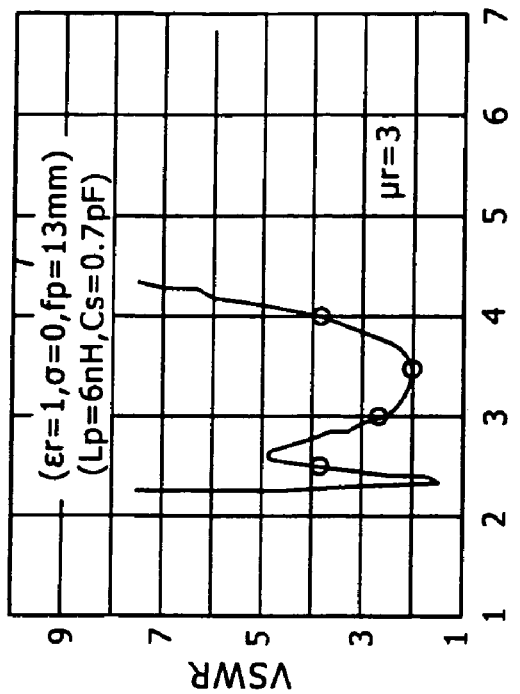
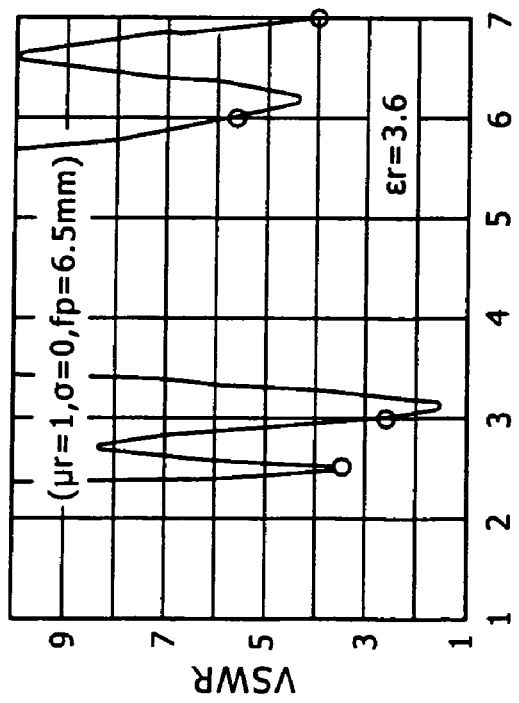

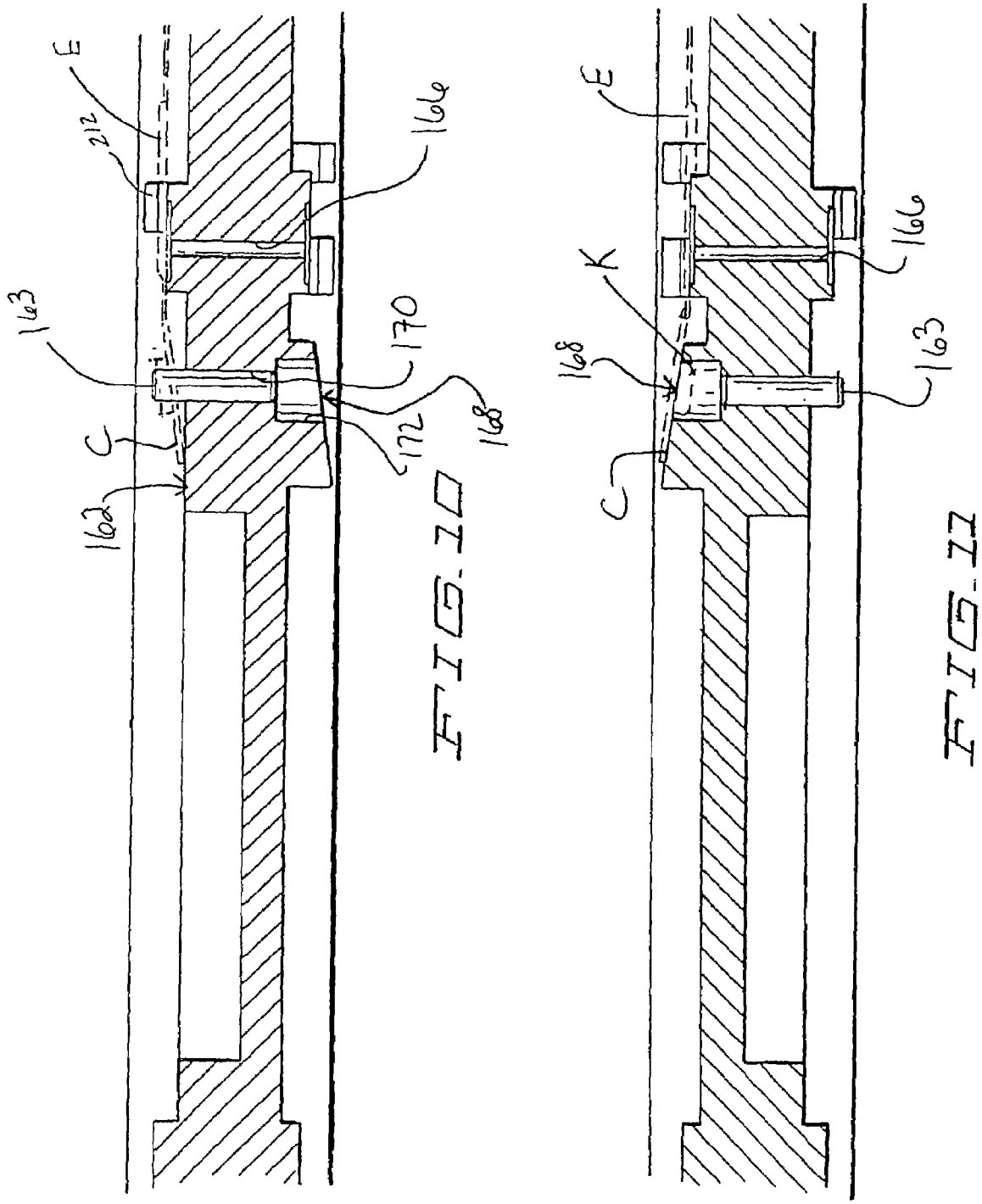

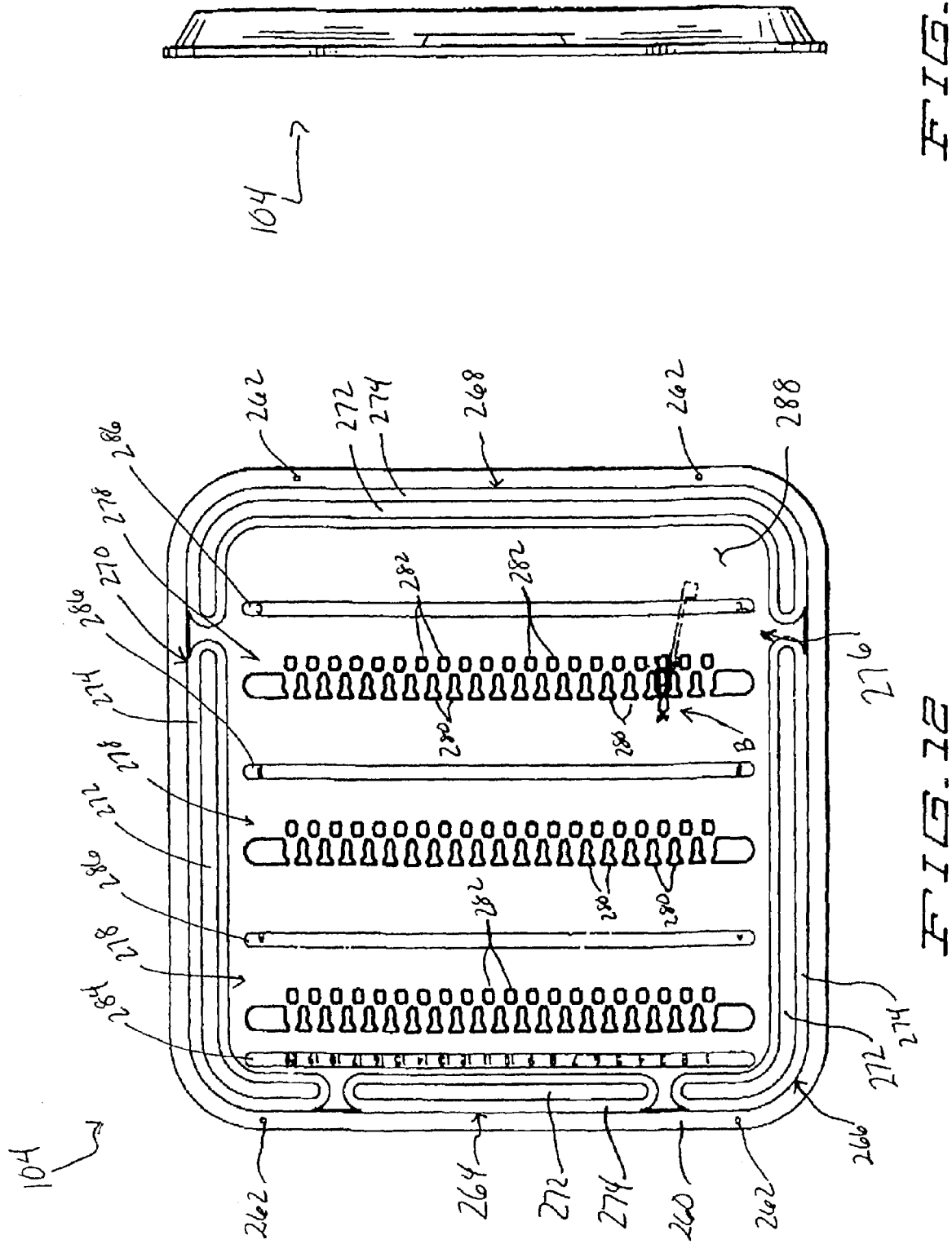

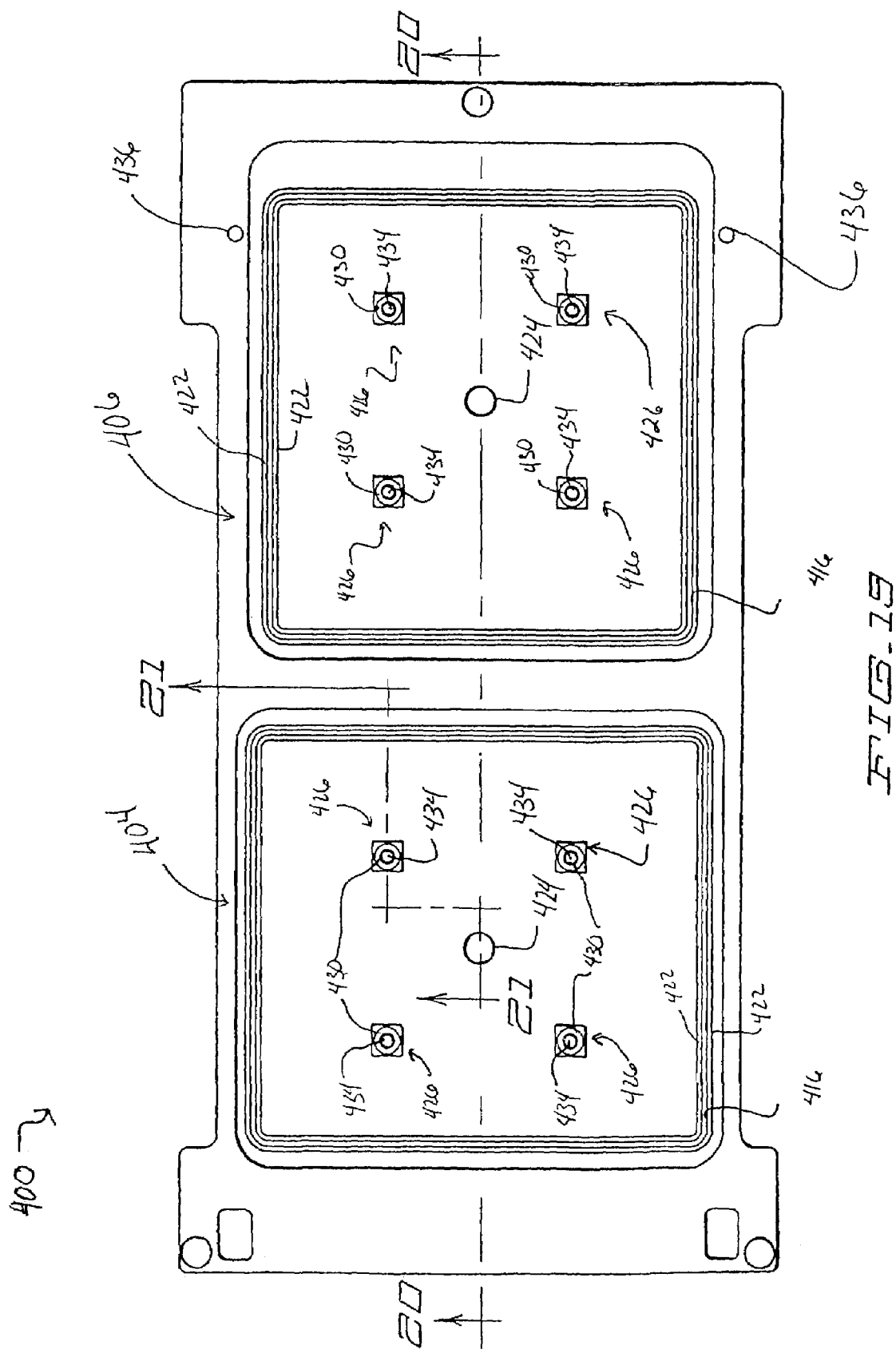

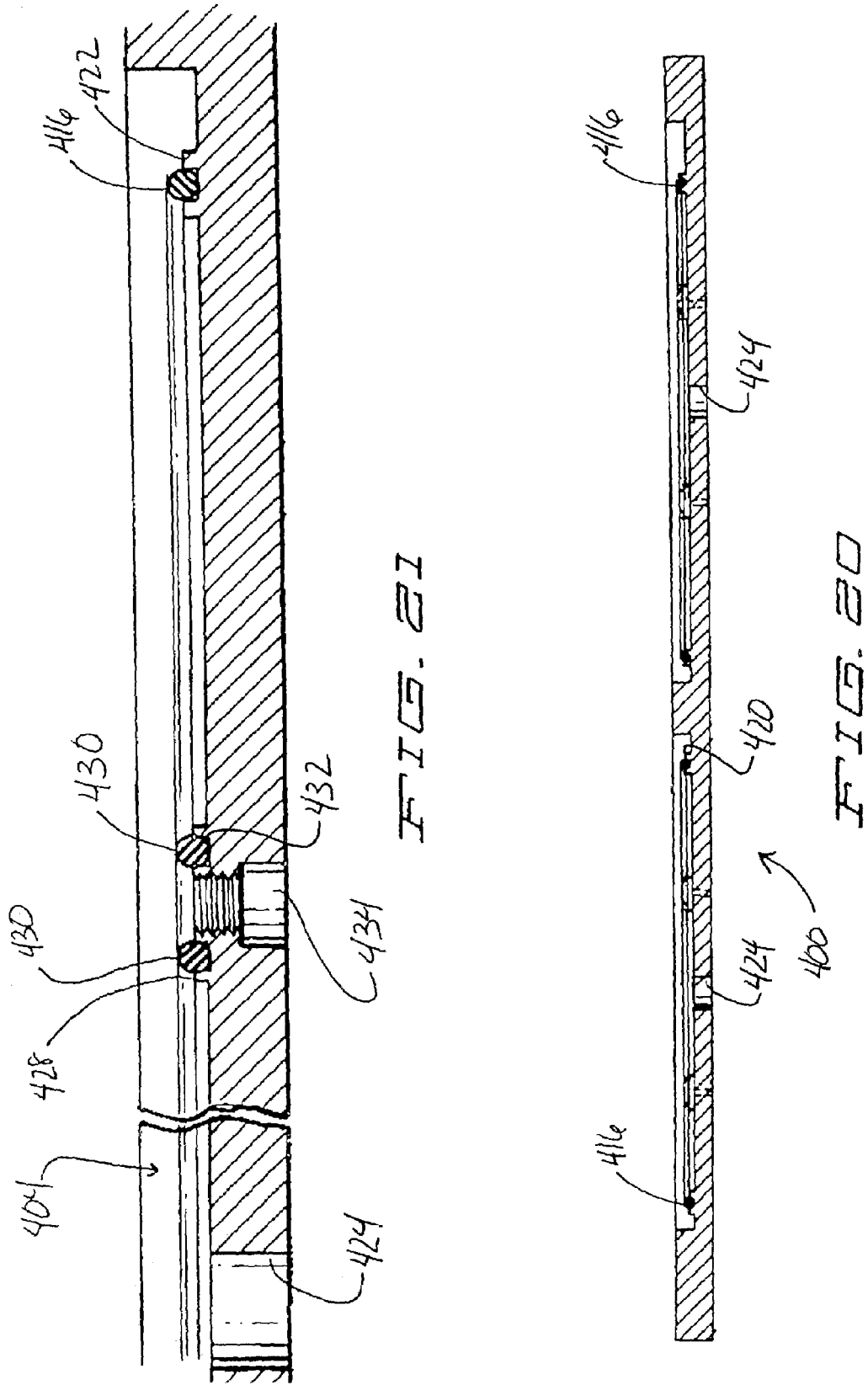

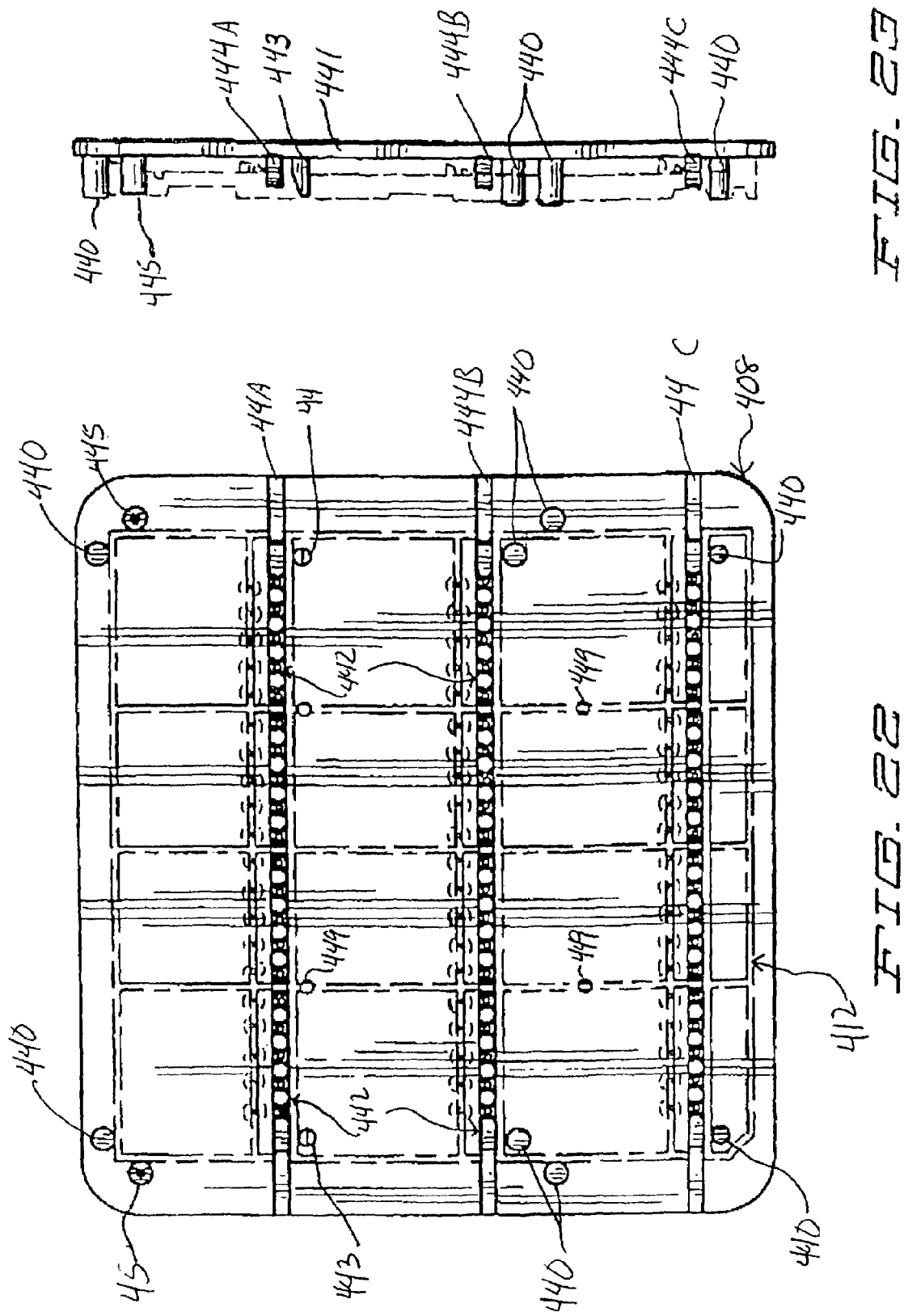

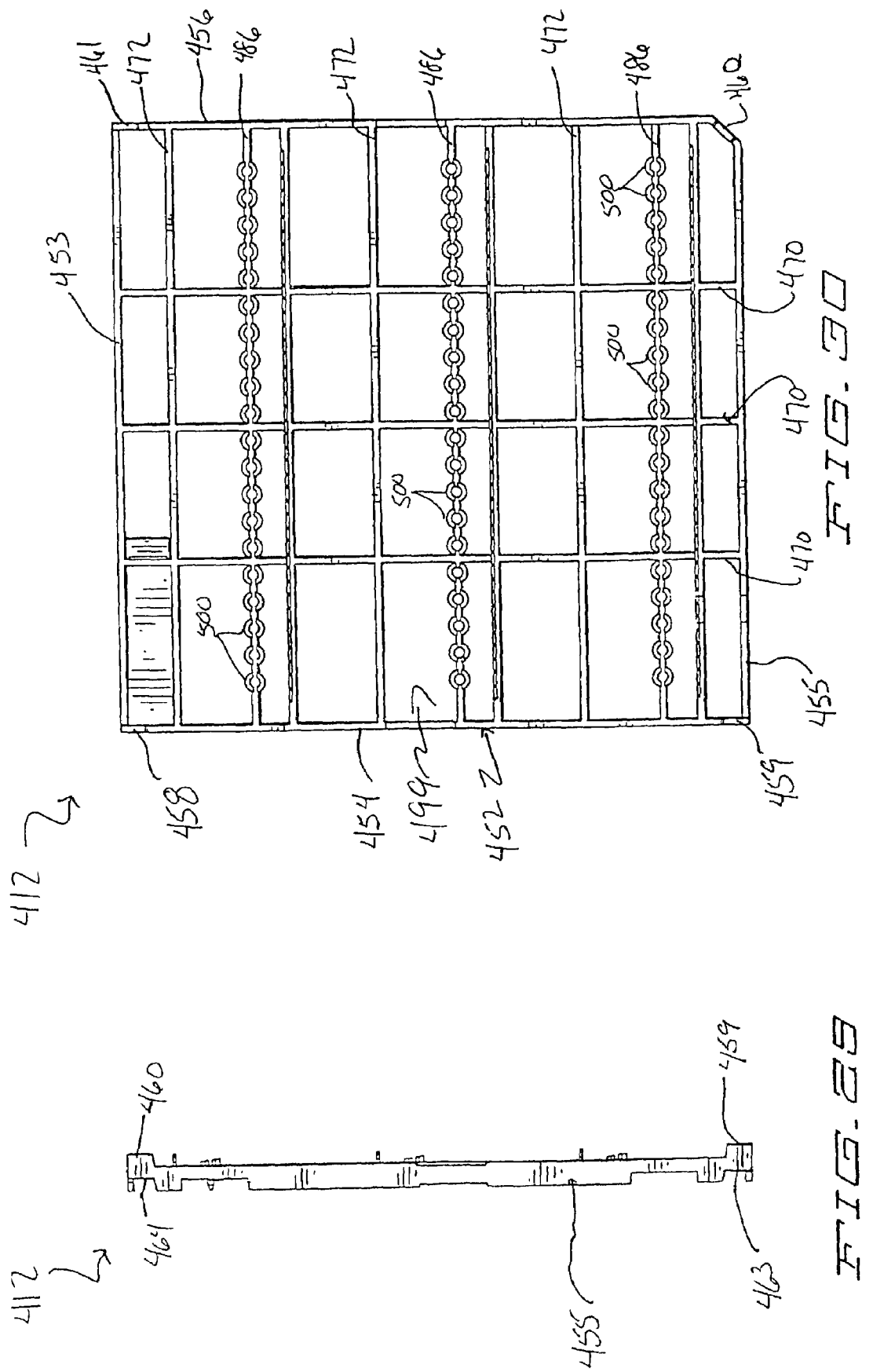

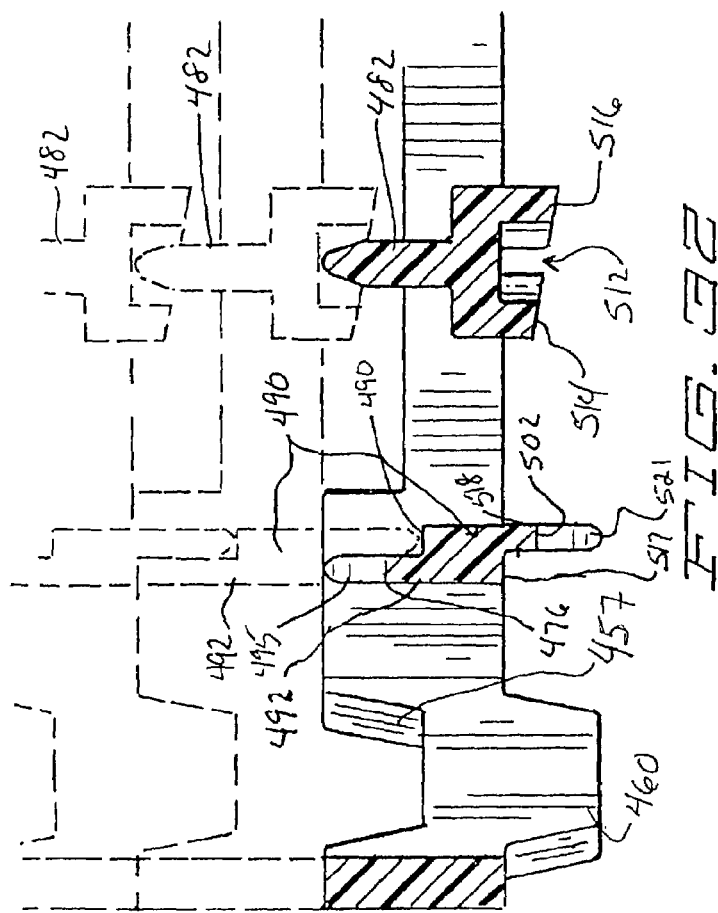
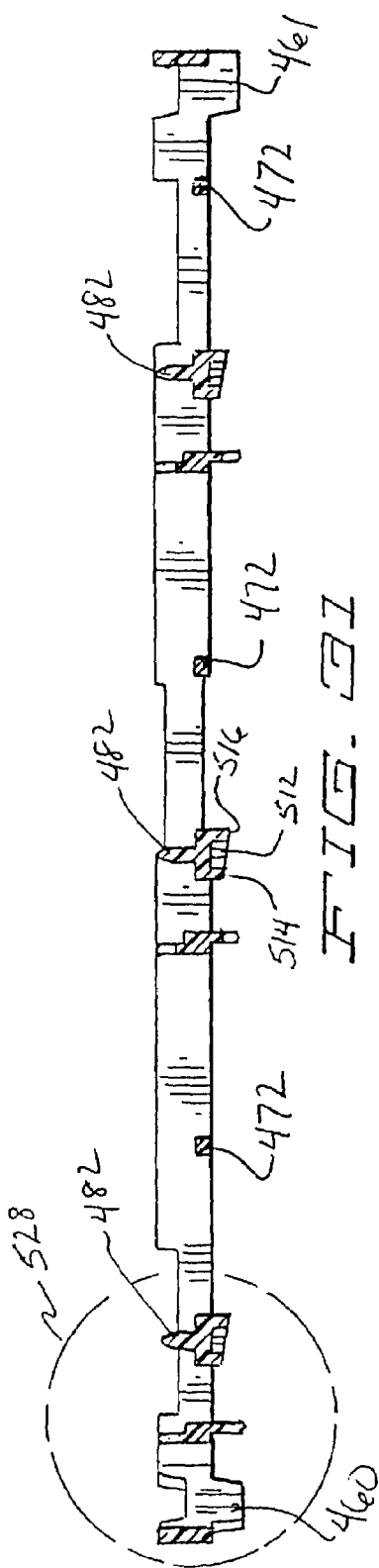

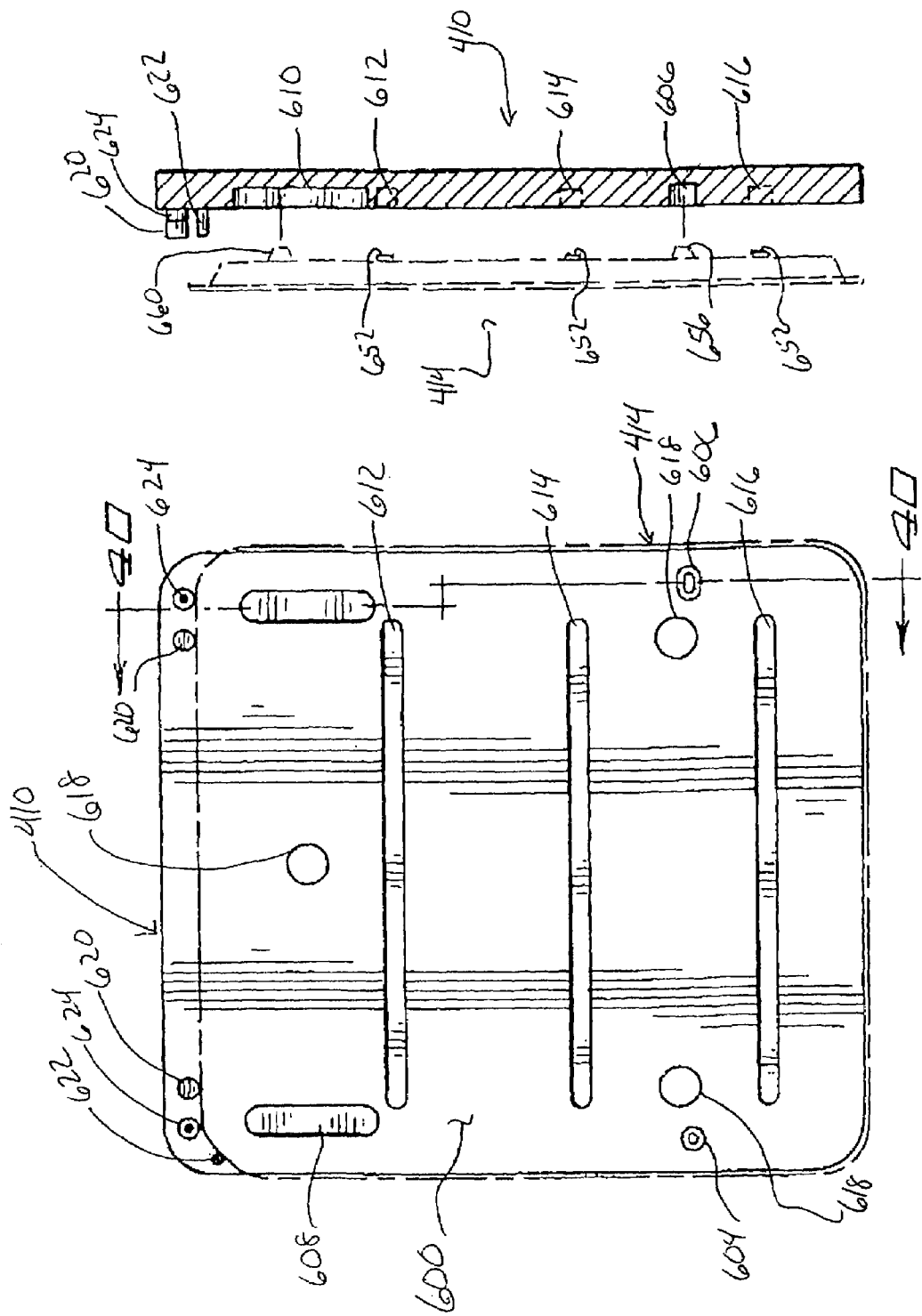

TRAY SYSTEM FOR HOLDING AND POSITIONING COMPONENTS

The present application is a continuation of application Ser. No. 09/409,010 for Processing Assembly and Method, filed on Sep. 29, 1990 now abandoned; which is a continuation of application Ser. No. 09/250,823 filed Feb. 17, 1999, now U.S. Pat. No. 6,266,869, for Method for Assembling Components, issued Jul. 31, 2001; the present application also claims priority to U.S. Provisional Patent Application Ser. No. 60/102,216 for Processing Tray, filed Sep. 29, 1998; and U.S. Provisional Patent Application Ser. No. 60/102,860, for Method for Manufacturing a Head Gimbal Assembly, filed Oct. 2, 1998; all of the specifications of which are incorporated by reference herein, in their entirety.

FIELD OF THE INVENTION

The present invention relates generally to the assembly of component parts into a combined unit and particularly to a novel, stackable processing tray useful for shipping component parts, holding the component parts during the processing, and subsequent shipping of assembled parts for further processing.

BACKGROUND OF THE PRESENT INVENTION

In many industries, component parts used in the assembly of a larger item of equipment are often shipped to an assembler in either disposable or recyclable packages. Typically, the manufacturer removes the component from the shipping package, and places the component into a processing fixture. The processing fixture holds the component sufficiently rigid such that certain processes can be performed on the component. Removal of a component from it's shipping tray and placement into the processing fixture can be done either by automation or manually.

While the foregoing describes a common method of assembling component parts into a larger whole, it also describes a process infused with complexity and cost. If the components are removed with automation, the capital cost of such equipment and related overhead adds cost to the manufacturer. If the components are removed manually, the labor rate of the operators performing this act also increases the manufacturer's cost. Further, in many cases, the processing fixtures employed by manufacturers are complex and costly. Finally, where the components are fragile or otherwise easily damaged, the removal of the component from its shipping package and its installation into a processing fixture—whether by hand or through some automated procedure—may result in costly component damage from the handling of the component.

As an illustration of the foregoing methods and processes and the problems associated therewith, the hard disk drive industry can be considered. A hard disk drive is the device most predominantly used for long term memory/data storage in modern computer systems. In overview, a hard disk drive comprises a disk that is rotated at high speeds. The disk has a magnetic coating or read/write media that can be selectively magnetized with the application of a magnetic field thereto. A "read/write" device, commonly called a head, is attached to and held closely adjacent the disk by a head suspension assembly and is moved radially relative to the rotating disk, that is, from the edge of the disk toward the center and back. Electric current is provided to the head which creates and applies a magnetic field to the disk as the head moves relative thereto. Selective areas of the disk are preferentially magnetized as the magnetic field is applied to the disk. Each magnetized area consists of a north and south pole selectively oriented in one of two preferred directions. Magnetized areas having a north pole pointing in one of the two direction are designated as a "0" and in the other direction as a "1." In this way the binary language of computers consisting of zeroes and ones is assembled on the magnetized disk coating and data and programs, which comprise zeroes and ones in binary computer language, are stored on the hard disk.

Continuing with the example of the disk drive industry, head suspension assemblies are shipped in disposable vacuum-formed trays to manufacturers who may attach the read/write head thereto. The manufacturers remove the head suspension assembly from it's shipping tray and place it into an intricate processing fixture, referred to as a "head bond fixture." Typically, head bond fixtures are precise, machined metal fixtures with several moving parts. Often times, these fixtures include a small clamping mechanism to hold the suspension assembly sufficiently rigid during the assembly process. The surface of the fixture which mates with the suspension assembly is ground to complex geometries with very tight tolerances, thus making them very costly. Once placed within the head bond fixture, the suspension assembly is held in such a manner that a read/write head can be bonded to it.

As in any industry, manufacturing costs in the hard disk drive industry are carefully monitored. The hard disk provides large amounts of storage capability at relatively low cost. As the technology continually matures, the storage density per unit of cost, that is, the quantity of data stored per dollar, is continuously increasing, as is the reliability of the hard disk and its related components, (collectively called the hard disk drive, hard drive, or disk drive) and the rate at which data can be transferred to and from the disk. That is, advancing hard disk technology is resulting in the storage of increasing amounts of information at decreasing unit costs. Yet, in spite of the rapid advance in storage technology, the technology continues to face cost pressures as competition in the marketplace intensifies and computer programs grow in size. It would be helpful if the cost pressures arising out of damage that occurs during the assembly process could be reduced as well as the cost pressures that result from labor or inflexible tooling intensive processes.

Head suspension assemblies are extremely fragile and susceptible to damage from handling such as that occurring during the assembly process. That is, the act of removing a head suspension assembly from it's packaging and installing it in a processing fixture can result in the destruction of the assembly or damage it so as to degrade seriously the suspension's later operational performance.

One source of possible damage to the components stems from electrostatic discharge (ESD) or electrical overstress (EOS), collectively referred to as ESD/EOS. ESD/EOS usually results from touching an object and causing a build-up of static charges. Prior to the time that the head suspension assembly is installed into a disk drive, the electrical interconnect is electrically connected to the read and write elements, but is not connected to the drive electronics. As a result, the individual conductors that make up the electrical interconnect, can easily be charged by stray voltages, thereby creating a voltage potential across the sensitive magnetoresistive or giant magnetoresistive read elements of the read/write head, which when discharged results in damaging current transients through the read element.

The components used in hard disk drives are small and continually decreasing in size. Consequently, any tolerance for ESD/EOS damage of the components during the assembly process is also continuously decreasing while their susceptibility to damage during assembly is increasing. The present methods of assembly, however, are the source for the creation of much static potential charge, whether through direct handling of the component parts or because of the human assemblers doing some normal activity such as shuffling their feet or wiping their brow. Minimizing the handling of the head suspension assembly is thus desirable, yet present packaging, transportation and assembly methods result in the need for an undesirable amount of such handling.

The small size of the components and their continually decreasing size also reduces any tolerance for misalignment of the components during the assembly process while increasing their susceptibility to damage during assembly. Current disk drive assembly includes expensive, labor intensive processes, particularly the assembly of the flex circuit to the suspension assembly. The labor intensive nature of the assembly process has several consequences. First, the labor increases the final cost of the assembled suspension. Second, because of the heavy use of labor in the assembly, there is a meaningful quantity of handling of the components by the assembler, which increases the likelihood of damage to the components. Third, the assemblers are limited in both the precision and speed with which the flex circuits can be assembled to the suspensions. Fourth, even though human assemblers are used, the assembly process is quite tooling intensive. Fifth, as the part geometries change as the technology advances, the costs also increase because of the need for new tooling in the assembly of the new parts; that is, the tooling used is either not adaptable or not readily adaptable to new part geometries.

Additional costs that are not included in calculation of the cost of the use of human assemblers are those of the consumer whose hard drive fails, perhaps due to damage to a component by a human assembler. Though data backups are always advised, such advice is often unheeded. When a hard drive fails the consumer may lose valuable data that is either not easily replaced or is replaced only at some cost in terms of time and effort, if not actual cash outlays.

Many of the foregoing deficiencies in the employment of human assemblers could be reduced or eliminated with a precision automated assembly apparatus and method for attaching flex circuits to suspensions. Automated assembly machines and methods should result in lower costs, reduced component handling and possible damage, and have greater flexibility to accommodate variations in component types, geometries and improved placement tolerances. Simple automation of the actual assembly of the flex circuit to the suspension will not, however, eliminate the problems associated with removing the components from their shipping trays and placing them in an assembly apparatus.

For the reasons discussed previously, there is a need for an inexpensive packaging tray that can also be utilized as a processing fixture. This approach has several advantages over the processes and apparatus described above. First, because the components need not be removed from the shipping tray during subsequent manufacturing processes, the likelihood of damage resulting from handling is significantly reduced. Second, the costs associated with the removal of the component from the shipping package are eliminated. Finally, this approach eliminates the need for costly processing fixtures.

SUMMARY OF THE INVENTION

It is an object of the present invention to provide new and improved apparatus that is not subject to the foregoing disadvantages.

It is another object of the present invention to provide a shipping tray for use in shipping suspensions used in the manufacture of hard disk drives that can also be used in the assembly of such hard disk drives.

It is still another object of the present invention to reduce the costs associated with the assembly of flex circuits to suspensions.

It is yet another object of the present invention to use a vacuum in the assembly of component parts to eliminate complex clamping and fixturing equipment and thereby reduce overall manufacturing costs by reducing tooling costs.

It is another object of the present invention to reduce critical tooling tolerances in automated assembly machines with the use of a novel packaging/processing tray and a vision alignment system.

The foregoing objects of the present invention are provided by a tray that can be used in the shipping of hard disk drive suspensions, in the assembly of the suspensions with other components, and in shipping the assembled unit to other manufacturers. In one embodiment of the invention, the tray has top and bottom surfaces each with surface features that function as component receptacles to engage with features of the component such that the component is loosely held in position. Within each component receptacle are one or more component receptacle through holes that pass through the thickness of the tray. The component receptacles on one surface are aligned with the component receptacles on the other surface. Thus, when multiple trays are stacked, the component receptacles on one surface will align with those of the tray above on the other surface. That is, when multiple trays are stacked for shipment the components are loosely engaged by the component receptacle on the top surface of one tray and the aligned component receptacle on the bottom surface of the tray above. The aligned receptacles enable the tray to be used with either receptacle in the "up" position if desired by the manufacturer.

Thus, the component receptacles on the top and bottom side of the tray are configured such that the components can be processed in multiple orientations. In one contemplated use of the present invention, head suspension assemblies are loaded into the trays with gimbal side down. When the trays are received by the manufacturer, the trays are unstacked with the gimbal side up, allowing them to attach the read/write head to the suspension without having to manipulate the suspension's orientation. During manufacturing operations, the tray is placed into a vacuum chamber in order to perform a manufacturing process on the components. The vacuum pressure acts through the receptacle holes of the tray and secures the components in place during the assembly process.

Alternatively, the tray of components may be placed over a pattern of vacuum ports. Each port protrudes through the receptacle holes and engages with the parts. When vacuum is initiated, the components are secured directly to the surface of the vacuum ports.

The tray is configured to be used in manufacturing operations in cooperation with a base forming a vacuum chamber as a processing assembly. The tray includes on each side thereof a sealing surface that engages a sealing surface on the base. The vacuum in the vacuum chamber is applied to the components in the tray through the component receptacle throughholes to hold the components in place.

In another embodiment of the present invention, a shipping/processing tray will include component repositories on opposing sides that do not include the vacuum through holes of the other embodiment. Once again, the component receptacles on one side will align with those on the other such that shaded trays will capture a component between aligned receptacles on facing trays.

In this latter tray embodiment, the tray will cooperate with a base having a vacuum chamber and a sub-tray configured to be seated upon the vacuum chamber and to seat the tray. The sub-tray will include a plurality of vacuum seats arranged thereon to cooperate with the component receptacles on the tray such that when the tray is seated thereon, the vacuum provided by the vacuum chamber will be transmitted through the vacuum seats to the components to hold them in place during manufacturing operations.

The base may include multiple vacuum chambers configured to seat multiple component trays or multiple component sub-trays and trays.

Operationally the tray of the present invention may be loaded with components, multiple trays may be stacked one upon the other and packaged, and the stacked tray package may be shipped to a manufacturer. The manufacturer will remove the tray from the stack, place it in a processing apparatus, and perform predetermined processes thereon. When processing is completed the trays will be removed from the processing apparatus, restacked, and repackaged for shipment to another manufacturer for further processing.

When components require only a single orientation, that is, with one particular side or feature in the "up" position, a tray in accord with the present invention may include a component receptacle on one side and an aligned protuberance or component restraining feature on the other.

In a particular embodiment of the present invention useful in the head disk drive industry a suspension tray in accord with the present invention will include component receptacles including a base plate seat and a load beam seat. In one variation of such a tray the load beam seat will include a vacuum hole in fluid communications with the vacuum chamber of the base when in an operational setting. In another variation the tray will be used in cooperation with a sub-tray having a vacuum seat configured to engage the suspension load beam in an operational setting. The vacuum seat will include a vacuum hole in fluid communication with the vacuum chamber in the base.

Stated otherwise, the present invention contemplates a tray for holding components having first and second sides, wherein the first side has at least one first component receptacle for engaging the component; and the second side has at least one component engaging member, and further wherein the first component receptacle and the component engaging member are aligned such that when multiples of the tray are stacked upon each other the first component receptacle and the component engaging member will cooperate to restrain the motion of the component relative to the tray. In such an embodiment the component will have at least first and second engagement surfaces and the first component receptacle will engage at least the first component engagement surface and the component engaging member will engage at least the second component engagement surface.

Additionally, the present invention contemplates a processing assembly comprising a base including at least one vacuum chamber and a tray, the tray being in fluid communication with the vacuum chamber and being useful for holding components during a process performed on the components. Where the component has at least first and second engagement surfaces the first component receptacle will engage at least the component engagement surface and the component engaging member may be a second component receptacle for engaging at least the second component engagement surface. The tray may further include a separable sub-tray that is interposed between the base vacuum chamber and the tray and that is in fluid communication with the base vacuum chamber, wherein the sub-tray includes a sub-tray component seat that has a vacuum throughhole in fluid communication with the vacuum chamber.

Such a processing assembly may also include at least a second vacuum chamber and a second component tray with the second component tray being in fluid communication with the vacuum chamber. Such a second component tray is useful for holding components during a process performed on the components and will have first and second sides with the first side having at least one first component receptacle for engaging the component and the second side having at least one component engaging member. The second tray first component receptacle and the component engaging member will also be aligned such that when multiples of the second component tray are stacked upon each other the component engaging member and the receptacle will cooperate to restrain the motion of the component relative to the second tray.

The foregoing objects of the invention will become apparent to those skilled in the art when the following detailed description of the invention is read in conjunction with the accompanying drawings and claims. Throughout the drawings, like numerals refer to similar or identical parts.

BRIEF DESCRIPTION OF THE DRAWINGS

FIG. 4 is a cross section view of the base shown in FIG. 3 taken along viewing plane 4—4 thereof.

FIG. 5 is an enlarged view of the cross-hatched circled area shown in FIG. 4.

FIG. 8 is a bottom plan view of the tray shown in FIG. 6.

FIG. 10 is an enhanced detail of the area shown in FIG. 9.

FIG. 11 is an inverted view of the detail area shown in FIG. 9.

FIG. 12 is a top plan view of a flex circuit tray in accord with the present invention.

FIG. 13 is a side elevation of the flex circuit tray shown in FIG. 12.

FIG. 19 illustrates a sub base for an alternative shipping tray configuration.

FIG. 20 depicts the sub base shown in a cross section view taken along viewing plane 20—20 of FIG. 19.

FIG. 21 depicts the sub base shown in a cross section view taken along viewing plane 21—21 of FIG. 19.

FIG. 22 shows a top plan view of a sub-tray and tray for positioning a suspension during assembly operations.

FIG. 23 shows a right side elevation view of the sub-tray shown in FIG. 22.

FIG. 29 shows a side elevation view of the suspension tray of FIG. 22.

FIG. 30 depicts the suspension tray of FIG. 22 in a bottom plan view.

FIG. 31 is a cross sectional view of the suspension tray shown in FIG. 22 taken along viewing plane 31—31 of FIG. 27.

FIG. 32 is a detailed view of a portion of the cross-sectional view shown in FIG. 31.

FIG. 39 depicts the sub-tray shown in FIG. 38 in a top plan view.

FIG. 40 illustrates in a cross sectional view the sub-tray shown in FIG. 38 taken along viewing plane 40—40 of FIG. 38.

DETAILED DESCRIPTION OF THE INVENTION

Figure 1:
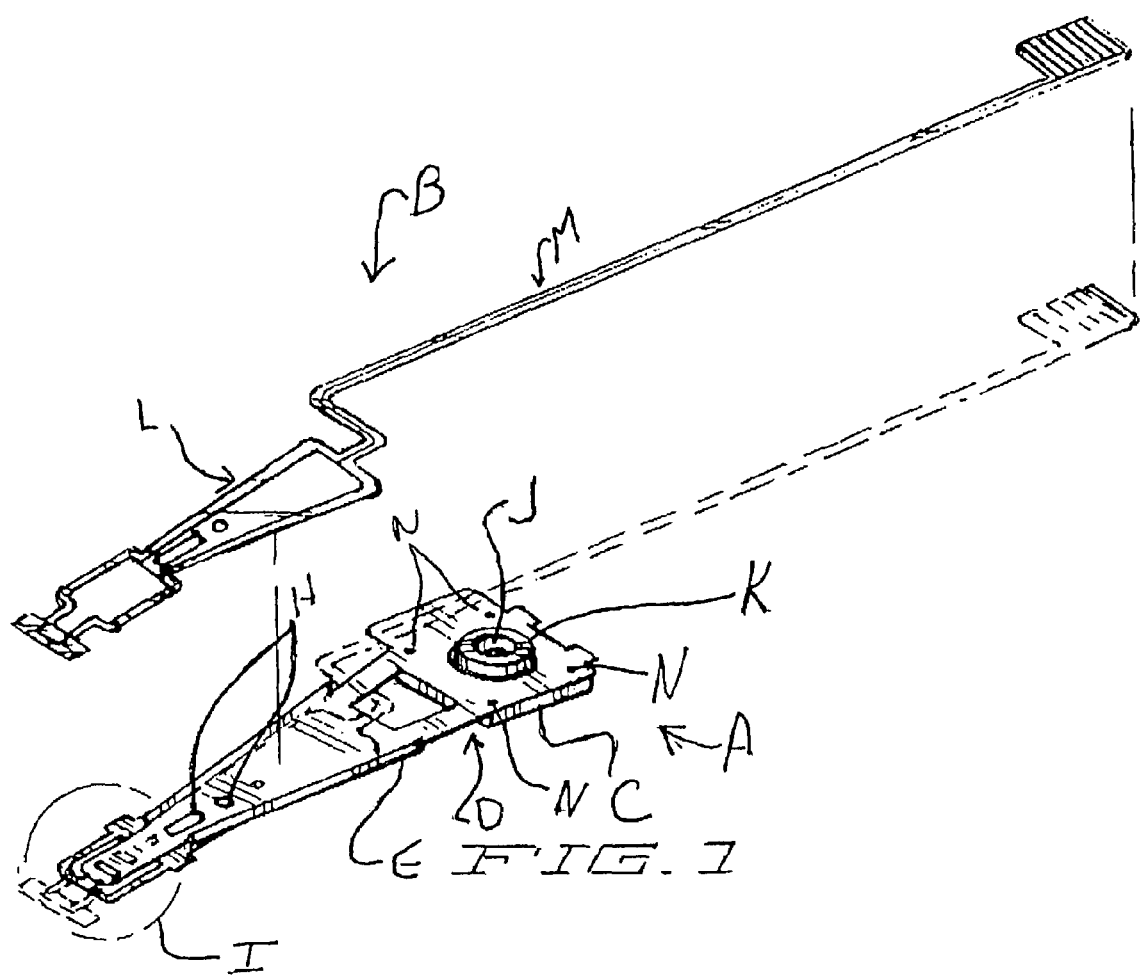
FIG. 1 is a perspective, exploded view of a suspension and an interconnect.
Figures 1A, 1B:
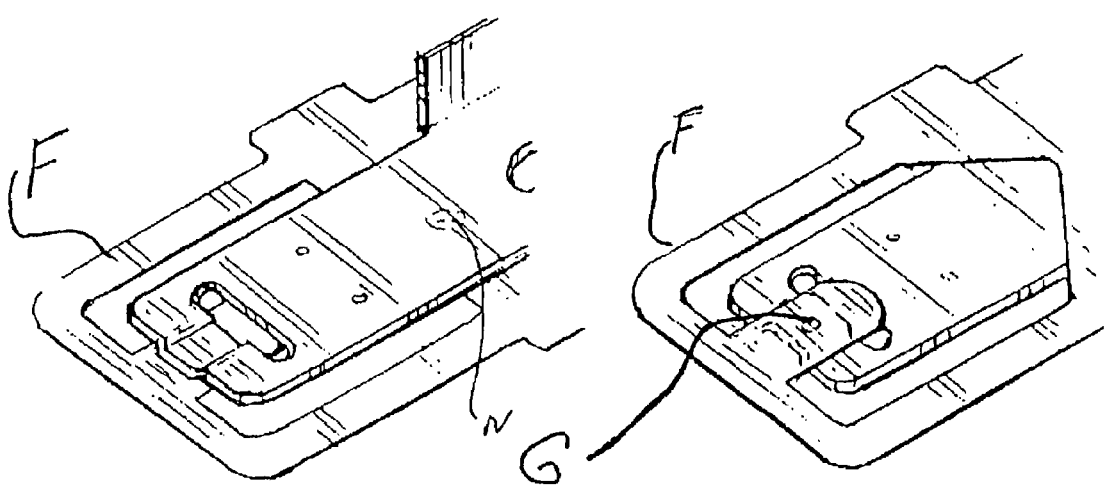
FIGS. 1A and 1B are details of the circled area I of the suspension shown in FIG. 1.

To begin illustration and discussion of a solution to the problems faced by the hard disk drive industry in the assembly of various component parts, reference is advantageously made to FIG. 1, which is an exploded view of a typical electrical flex/suspension assembly, and FIGS. 1A and 1B, which are detailed views of a portion of FIG. 1.

FIG. 1 illustrates several components including a suspension A and a flexible circuit B. It will be understood that the actual physical structures of these components may vary in configuration depending upon the particular disk drive manufacturer and that the assembly shown in FIG. 1 is meant to be illustrative of the prior art only. Typically, the suspension A will include a base plate C, a radius (spring region) D, and a load beam E. Typically the load beam E is bent in such a way that it causes a spring force, normal to the media disk, to act on the read/write head in operation. This spring force is counteracted by the lift forces that result from the read/write head's flight over the spinning media disk. The load beam E is usually bent near the baseplate C of the head suspension assembly.

A typical suspension A will also include a gimbal F having a gimbal load point G, which is best seen in the detail I shown in FIGS. 1A and 1B. At least one tooling aperture H may be included. The suspension A may further include an opening or hole J extending through the base plate C and load beam E and a surrounding collar K.

A flex circuit B may include a base, which may be a synthetic material such as a polyimide, that typically supports a plurality of electrical traces or leads of the flex circuit. The flex circuit B may also include a polymeric cover layer that encapsulates selected areas of the electrical traces or leads. Referring briefly to FIG. 1 again, it will be observed that the flex circuit B includes a suspension portion L and an interconnect portion M.

The read/write head that is mounted on the head suspension assembly is mounted to the gimbal F.

Structurally, suspensions such as that shown in the Figures have the base plate C and gimbal F welded to the load beam as indicated by weld points N. The flex circuit B is in turn adhesively attached to the suspension A Stated otherwise, suspension A is essentially a stainless steel support structure that is secured to an armature in the hard disk drive. The read/write head (which is not shown for purposes of clarity) is attached to the tip of the suspension A with adhesive or some other means. The aforementioned electrical interconnect is terminated to bond pads on the read/write head and forms an electrical path between the disk drive electronics and the read and write elements in the read/write head. The electrical interconnect is typically comprised of individual electrical conductors supported by an insulating layer of polyimide and typically covered by a cover layer.

Figure 2:
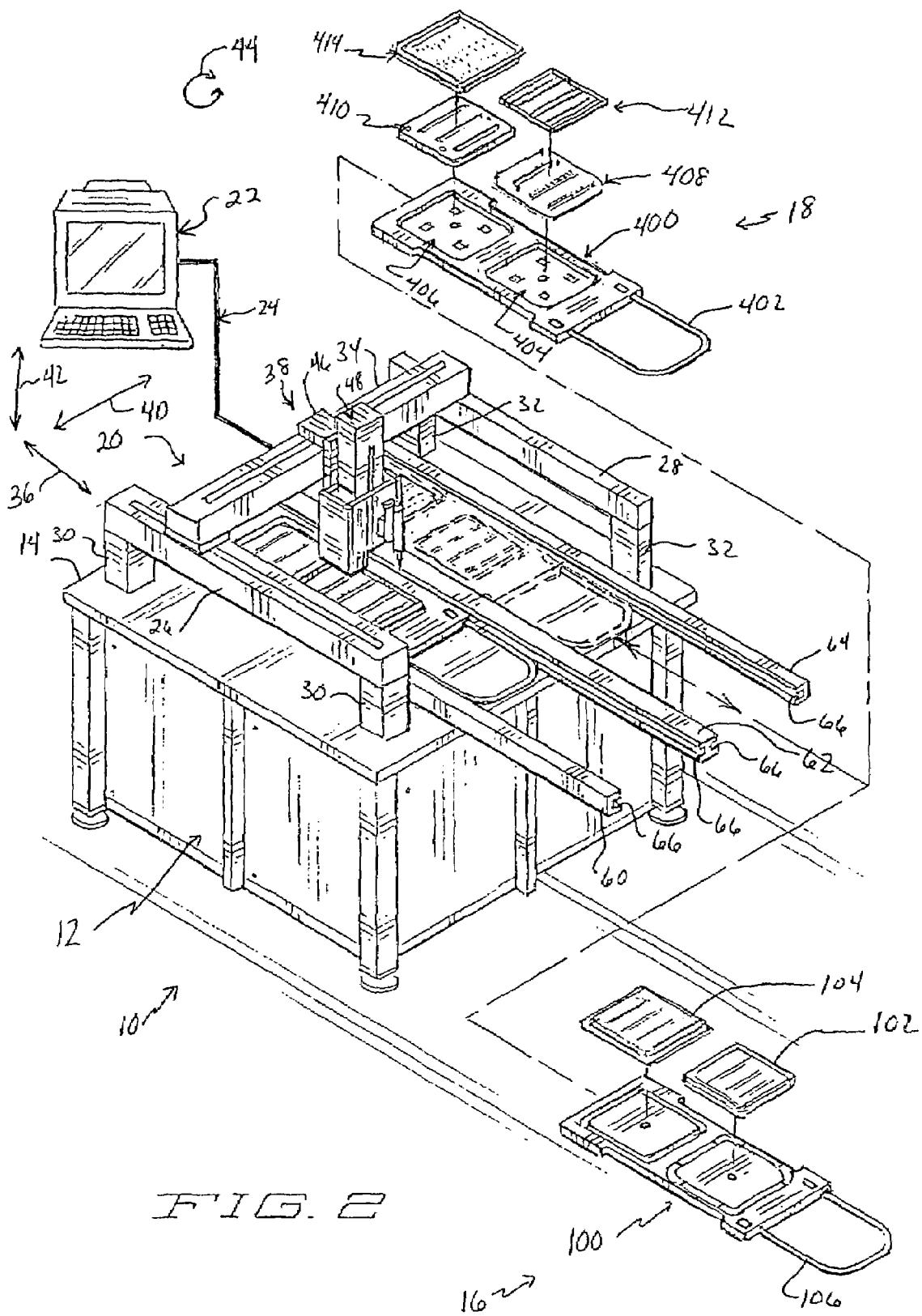
FIG. 2 is a perspective, exploded view of an automated flexible suspension assembly apparatus and alternate embodiments of a shipping/processing tray in accord with the present invention.

FIG. 2 shows in a perspective view, with alternate embodiments of shipping/processing trays shown exploded relative thereto, an apparatus 10 for assembling flexible circuits to a suspension such as suspension A. An apparatus 10 (such as that illustrated herein) has been more specifically described and illustrated in U.S. patent application Ser. No. 09/250,823.

Apparatus 10 includes a cabinet 12 and may include a dust cover (not shown for purposes of clarity of illustration), which may be hingeably attached to the cabinet 12. Cabinet 12 supplies the support structure for the assembly apparatus to be described in greater detail hereafter. Cabinet 12 may include a table 14 that supports a plurality of processing assemblies 16 and 18 at predetermined locations. Processing assemblies 16 and 18 are alternative embodiments in accord with the present invention and will be described in greater detail to follow. Processing assemblies 16 and 18 hold components to be attached or otherwise connected to each other, for example, flex circuits and suspensions. Cabinet 12 also supports an xyz and θ robot 20 that is controlled by an appropriately programmed computer 22 or other appropriate device over a line 24. Robot 20 is capable of manipulating parts in an orthogonal xyz coordinate system rotationally about the z axis, thus providing manipulation in the θ angular direction.

It will be understood by those in the art that both processing assemblies 16 and 18 could be placed in any desired arrangement relative to robot 20 and that the components contained therein could also be arranged as desired within the processing assemblies. In any event computer 22 will be programmed with the necessary information as to the relative locations of the processing assemblies relative to the apparatus 10, the locations of components therein relative to the assemblies, and if desired the orientations of the components. It will be further understood that in a preferred embodiment of the apparatus 10 that processing assemblies 16 and 18 will be disposed relative to the hinged cover such that a processing assembly may be removed holding completed product while assembly is continuing with respect to the other processing assemblies.

The particular robotic system or apparatus 20 shown in the Figure is of the type presently manufactured by Zmation, Inc. of Portland, Oreg., and additional details concerning its construction and operation can be obtained from the manufacturer. Other manufacturers of similar robotic apparatus include Anorad Corporation of Hauppage, N.Y.

Robot 20 is movable in a plurality of rectangular coordinate axes and in at least one angular or rotational degree of freedom, as will be described hereafter. In addition, as is known in robotic assembly equipment, robot 20, could, if desired, include the ability to manipulate components in additional degrees of freedom, that is angularly.

Robot 20 includes a pair of horizontal rails 26, 28 each supported by a pair of posts 30, 32, respectively. A transverse rail 34 is movable along rails 26 and 28 in the direction indicated by double-headed arrow 36. Thus, rail 34 is movable in the X direction or along the X axis and is sometimes referred to in the art as the X stage.

Rail 34 supports a manipulator arm 38 that is transversely movable relative to the rails 26 and 28 along transverse rail 34 in the direction indicated by double headed arrow 40. Thus, arm 38 is movable in the Y direction or along the Y axis and is sometimes referred to in the art as the Y stage.

In addition, portions of the manipulator arm 38 will also be movable in the direction of double headed arrow 42. This is the Z direction or Z axis. Portions of the arm 38 are also movable in an angular direction as shown by double headed arrow 44.

Collectively, it will be understood that arrows 36, 40, and 42 define a rectangular or xyz axis coordinate system and that the manipulator arm portions to be described hereafter are rotatable about the Z axis as noted earlier.

Various devices are known in the art for providing movement in a robot system such as that illustrated here. For example, movement along each axis could be provided by an appropriate device for providing linear motion, such as linear servo motors or other linear actuator mechanisms, such as ball screw or stepper motors, for example. In the preferred embodiment, motion in the vertical or upright direction will be provided by a linear voice coil motor with voltage feedback.

To provide the ability to control the robot 20 and position it where desired for the assembly operations, each motion providing device will include the appropriate position feedback system for providing position information to the controller or computer 22. Movement in the angular or θ direction can be provided by a rotary servo motor with an encoder providing he desired feedback. As with the movement in the rectangular coordinate system, the angular movement could be provided with alternative devices including any other known type of rotary actuated stage mechanism capable of providing the desired motion at the desired accuracy. Once again, the rotary motion mechanism will provide controller or computer 22 with the appropriate position information.

Manipulator arm 38 includes as shown a load support portion 46 and an upright portion 48 elongated in the upright direction, though this configuration is not critical to the present invention. Portions 46 and 48 provide a support for the tools and instruments used to attach the components to be assembled to each other. These tools and instruments include a global vision system, an adhesive dispense system, a vacuum collet, an adhesive tack system, and a local vision system. The manipulator arm 38 includes a global vision imaging system that includes in a preferred embodiment a charged couple device (CCD), camera, a lighting system, and the appropriate lens and positioning algorithms. The GVS is useful for globally or grossly positioning the arm 38 relative to each of the processing assemblies 16 and 18. The GVS will also determine the position of the processing assemblies 16 and 18 relative to an absolute coordinate system defined by the position feedback systems used with the XY stages. A particular advantage of using the GVS is that precise positioning of the component processing assemblies 16 and 18 within the apparatus 10 is not required. In addition, the GVS will take into account any variations in the manufacturing tolerances of the component processing assemblies 16 and 18. That is, even assuming that the processing assemblies 16 and 18 were precisely positioned relative to the apparatus 10, manufacturing tolerances in the processing assemblies 16 and 18 could result in the actual components being located at differing locations. These position differences in the component locations are thus accounted for by the GVS.

Also included is a local vision system (LVS). As with the GVS, LVS may include a CCD camera, a lens system, a lighting system, and vision processing tools/algorithms used by the appropriate controller or computer 22 to aid in the precision positioning of the arm 38. The CCD camera is preferably mounted to the arm 38 so as to be movable in the X and Y directions. Where the GVS was used to grossly position the arm 38 relative to the component processing assemblies and thus the absolute coordinate system defined by the position feedback system, the LVS is provided for locating the arm 38 relative to actual components to be assembled to each other. Thus, the LVS can be operated to image the components, such as a flex circuit and a suspension. These images can then be used by the computer 22 or other controller as desired, each supplied with the appropriate vision processing software, to control the movement of the robot 20 in the X, Y and θ stages. In this way then, the robot 20 can be precisely positioned with respect to first one component, such as a flex circuit, and then relative to a second (or third or more components if multiple components are being assembled to each other) in order to assemble the components to each other. Preferably, the absolute position relative to the global coordinate system will not be used to precisely position the arm 38 relative to the components. Rather, the position of the components themselves relative to each other will provide the position information used for the precision alignment of the components relative to each other.

Additional detail concerning the apparatus 10 and its methods of operation can be found in U.S. patent application Ser. No. 09/250,823 filed Feb. 17, 1999, the specification of which is incorporated herein in its entirety.

It will be observed that the assembly apparatus 10 will utilize removable processing assemblies such as assemblies 16 or 18 in the assembly of a flex circuit (to a suspension). As shown in the Figure, the assembly apparatus 10 includes a plurality of rails 60, 62, and 64. Three such rails 60–64 are depicted in the Figure, though it will be understood that the number of such rails can vary depending upon the size of the apparatus 10. Rails 60 and 64 each include a slot or channel 66 while rail 62 includes a pair of slots or channels 66. FIG. 2 also depicts, as noted earlier, alternate embodiments of processing assemblies 16, 18 in accord with the present invention that may find particularly advantageous use in the assembly apparatus 10.

In operation, the assemblies 16 and 18 will be loaded into the apparatus 10 by sliding the assemblies inwardly in the slots or channels 66 between either rails 60 and 62 or rails 62 and 64. It will be understood that the rails and slots are configured to slidably receive the processing assemblies and are spaced an appropriate distance apart such that the assemblies may be received and held therein.

Figure 3:
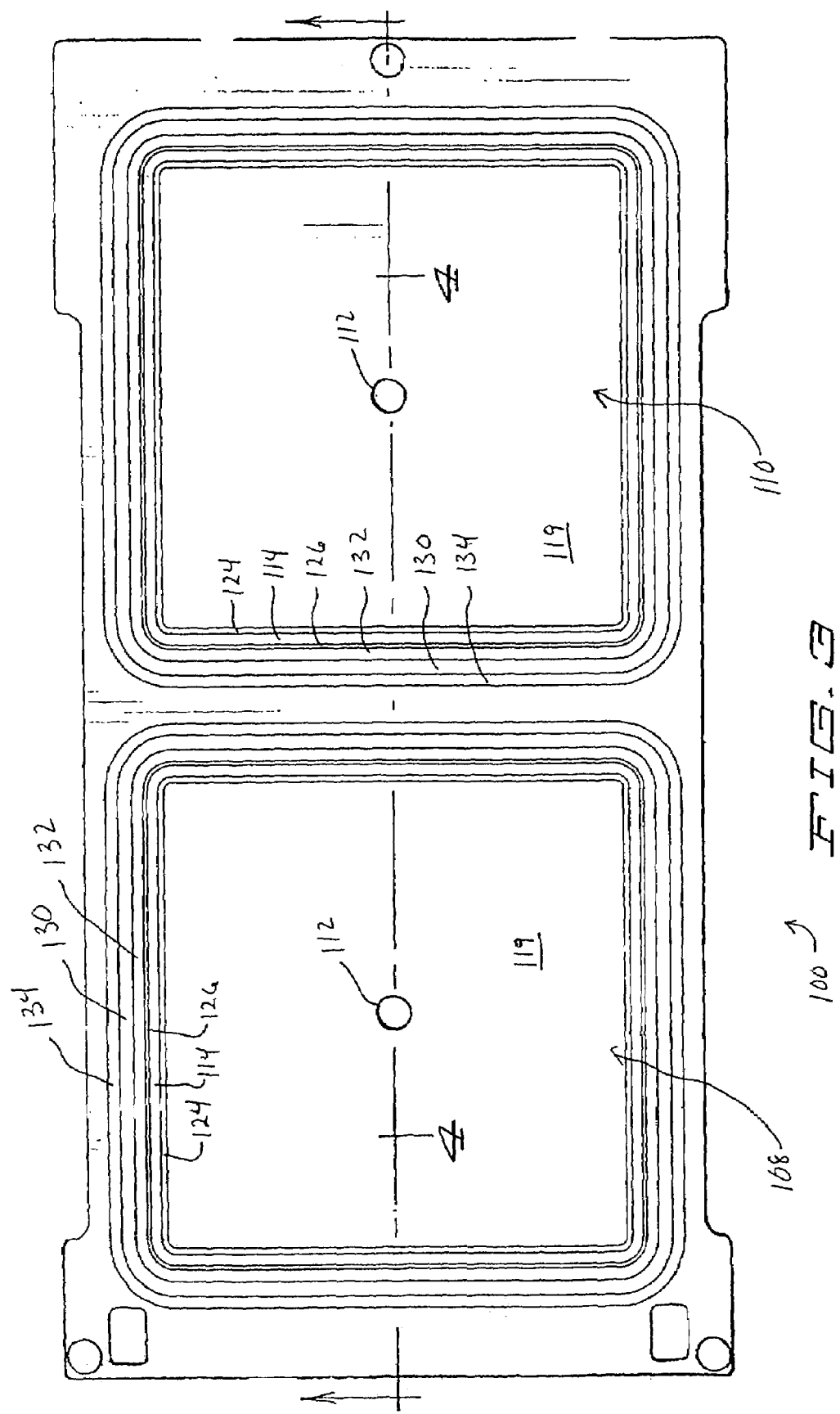
FIG. 3 is a top plan view of a base for holding a shipping tray in accord with the present invention.

FIGS. 2–18B show the processing assembly 16 in greater detail. Processing assembly 16 includes a base 100 for receiving and holding during processing a pair of shipping trays 102, 104 and, if so desired, a handle 106. Referring specifically to FIGS. 3–5, it will be observed that base 100 can appropriately function as a vacuum chamber. Thus, base 100 comprises at least one, and as shown, a pair of recessed vacuum chambers 108, 110, thereby providing the function of a vacuum manifold. The number of vacuum chambers will vary depending upon the number of shipping trays received thereby, with preferably a one-to-one correspondence therebetween. In the embodiment shown, the apparatus 10 will be attaching a single component part to another component part. The present intention is not so limited however, and thus where the assembly apparatus will be attaching more than two parts to each other, the base 100 can include more than two vacuum chambers. Additionally, as shown in the Figures, the chambers 108, 110 have a substantially square configuration. It will be understood, however, that the base 100 and chambers 108, 110 can be appropriately configured to correspond to the trays 102, 104 to be received thereby and that the present invention does not require that the vacuum chambers be of substantially the same shape, only that they correspond in configuration to the tray that they receive.

Disposed substantially in the center of each vacuum chamber 108, 110 is a vacuum port 112, which will be sealingly connected to an appropriate vacuum source (not shown for purposes of clarity). Each chamber 108, 110 includes an O-ring seal disposed within an appropriately configured recess 116 in base 100, shown in greater detail in the enhanced detail 118 of FIG. 5. The O-ring 116 will form a seal with the surface of the shipping trays 102, 104 when they are in place. When these trays are properly in place, vacuum is applied through the vacuum ports 112 to hold the trays and to hold the parts on the trays in precise positions for assembly, as will be explained further below. The O-ring 114 can be eliminated where the respective engaging surfaces of the bases and trays/sub-trays are machined to a flat enough finish such that sealing is accomplished by engagement of the surfaces alone. When an O-ring is used here, it is anticipated that the O-ring will compress sufficiently such that the tray thereabove will come into contact with the base below so as to force the tray to assume the same plane as the previously leveled base.

Referring still to the vacuum chambers, it will be observed that each chamber is shown as including a substantially planar bottom surface 119 and a substantially planar, encompassing side wall 120 disposed at substantially right angles thereto. The O-ring seal recess 116, like the vacuum chambers, is disposed within the upper surface 122 of the base 100, leaving two shoulders 124, 126 on either side thereof. The top surface 122 of the base 100 also includes a mating channel 128 comprising a bottom surface 130 and outwardly sloping side surfaces 132, 134 as shown. Once again, the particular configuration of the channel 128 is not critical to the present invention. The channel 128 serves to locate the trays 102, 104 precisely when received and thus any configuration providing such a function is within the scope of the present invention.

Figure 6:
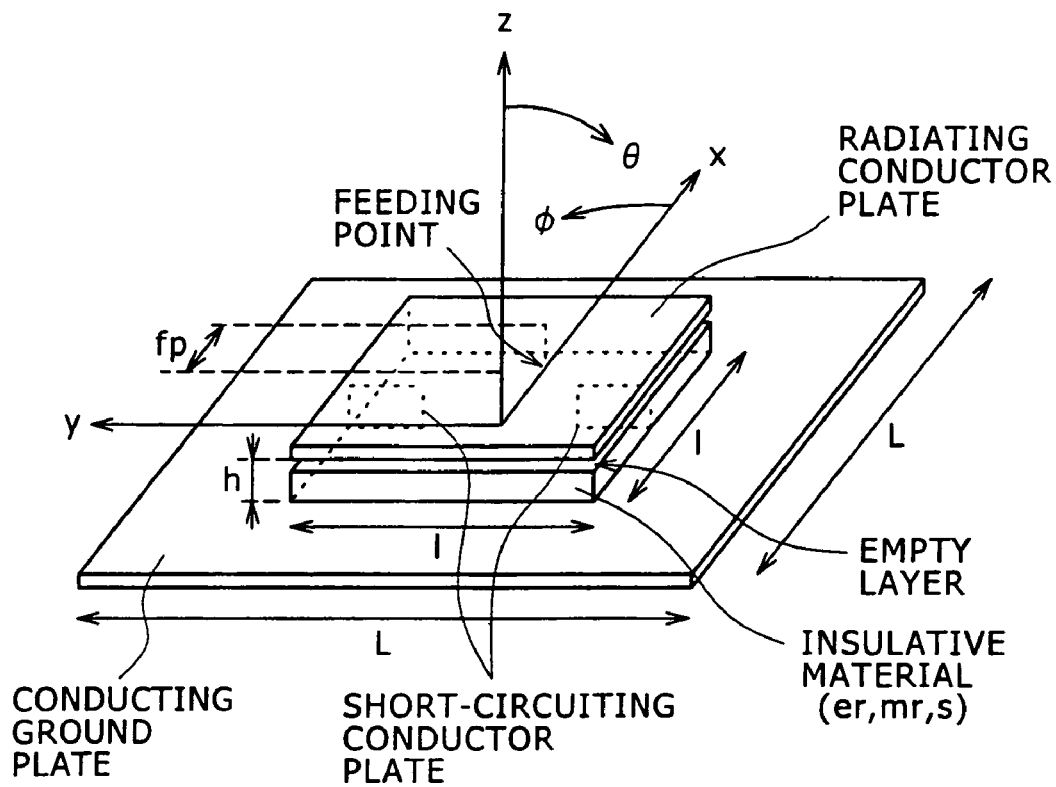
FIG. 6 is a top plan view of a shipping and processing suspension tray in accord with the present invention.
Figure 7:
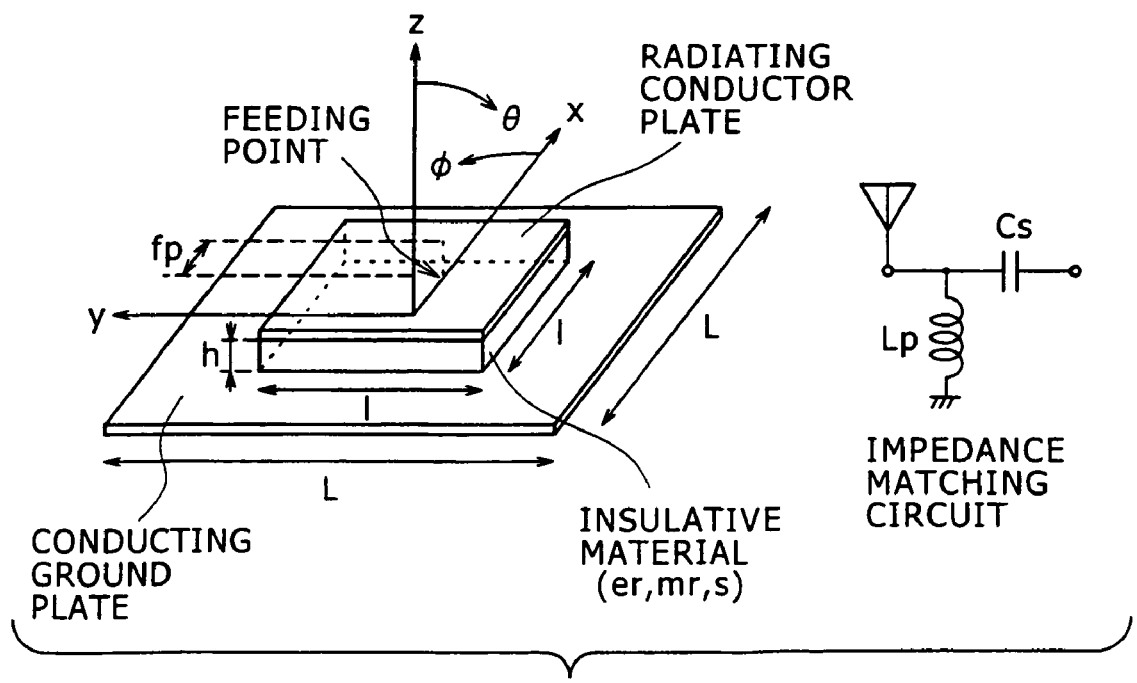
FIG. 7 is a side elevation view of the tray shown in FIG. 6.

As noted, the base 100 receives trays 102, 104 during the assembly procedure. Trays 102 and 104 are more specifically shown in FIGS. 6–11 and 12–15 respectively. Tray 102 will be described first and as shown is configured to receive and hold suspensions of the type previously described generally with respect to FIG. 1. Tray 102 is shown in FIGS. 6 and 8 in top and bottom plan views, respectively. Tray 102 is advantageously configured to be used as a shipping tray for suspensions, as a processing tray for use in conjunction with base 100 for the attachment of flex circuits to the suspensions, and as a shipping tray for the completed assembly. Thus, it is configured, as will be discussed and described in greater detail, to "trap" or contain the components and assembled products between adjacent, stacked trays during shipping. That is, preferably, as shown and as described herein, the trays 102 are stackable to facilitate processing, packing and shipment. Furthermore, the unique configuration of tray 102 will enable the manufacturers and shippers to utilize the tray in either the "upright" position shown in FIGS. 6 and 10 or in an "inverted" position as shown in FIG. 11. Thus, because such nomenclature as "upright" and "inverted" or "top" and "bottom" are relative based upon the particular orientation of use by the manufacturer/assembler, it will be understood that such terms are used for convenience and not as an indication of preferred orientation.

Tray 102 as shown has a substantially square configuration, though it will be understood that other configurations are also useful and in accord with the present invention. Tray 102 includes a plurality of optical fiducials 140, which are useful in enabling the apparatus 10 or other assembly apparatus to locate the precise location of the tray 102 relative thereto for precision assembly operations. As shown the fiducials 140 are located on the outer upper edge surface of the tray 102, though it will be understood that they could be located elsewhere. With particular reference to the apparatus 10, the global vision system will utilize the fiducials to roughly determine the location of the tray 102 and the suspensions held thereby.

Figure 9:
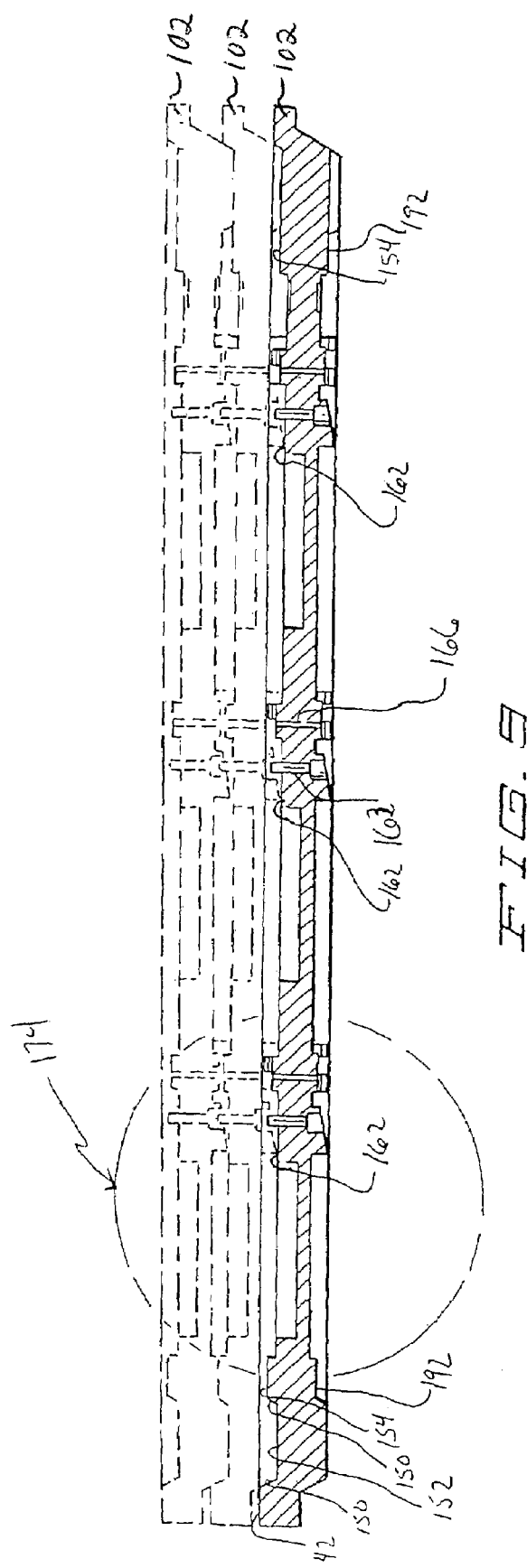
FIG. 9 is a cross section view of the tray shown in FIG. 6 taken along viewing plane 9—9 shown in FIGS. 6–8.

Referring particularly to FIGS. 6, 7, and 9–11, the top or first side of tray 102 will be described. Tray 102 includes a plurality of mating grooves 144, 146, and 148 disposed therein. Grooves 144 and 146 extend in opposite directions from substantially the center of a first side of the tray 102 around the adjacent side and partially around the side opposite the first side such that groove 148 lies disposed between the ends thereof. It will be understood that the grooves 144–148 are used to mate with appropriately configured tongues on the bottom or lower side of the tray 102 such that the trays can be appropriately stacked on top of each other as seen in FIG. 9. Groove 148, which is shorter in length than grooves 144-46, together with grooves 144–46 function as keys to orient the stacked trays in the same direction. Each groove is defined by inwardly sloping sides and a substantially flat bottom side. Thus, describing the groove surfaces moving inwardly from the outer edge surface 142, adjacent to surface 142 and angularly disposed with respect thereto is a groove side surface 150 and a bottom surface 152. Groove side surface 150 extends continuously around all sides of the bottom surface 152.

Inwardly adjacent to the grooves 144–48 is a shoulder of shelf 154. Shelf 154 provides a sealing surface for the 0-ring 114 when the tray 102 is inverted. Lying inwardly of the shelf 154 is the repository 156 wherein the suspensions or other appropriate component part resides. During shipping, adjacent stacked plates will cooperate to retain the suspensions in place in the repository 156 while in operation during assembly the tray 102 will cooperate with the vacuum chamber Repository 156 as shown is specifically configured to receive and retain suspensions of the general type shown in FIG. 1. As configured, the tray 102 will hold sixty (60) such suspensions, though the exact number is dependent upon the size and configuration of the tray as well as the assembly apparatus into which it will be inserted. Further as shown, the repository is constructed such that there are three rows of twenty suspensions, which is again dependent upon the same factors as previously mentioned. Included within the repository 156 is a number line 158 that advantageously denotes the position of the suspension across the width of the repository 156. In addition, each row is labeled with a letter, either A, B, or C, to denote in which row a particular suspension lies.

As shown the repository 156 includes three rows 160 of base plate seats 162 including stakes 163 and three rows 164 of load beam seats 165 including vacuum ports 166 (best seen in FIGS. 16–18B) associated therewith. A base plate seat 162 and a load beam seat 165 cooperate to define a component receptacle. The stakes 163 are received within the opening J defined by the collar K of a suspension A such as that shown in FIG. 1 and FIGS. 16–18B. Referring to FIG. 10, it will be seen that a stake 163 is received within an appropriately configured aperture 168 that extends from top to bottom surface of tray 102. The aperture 168 includes first and second portions 170, 172 having differing radii wherein the radius of the first portion 170 is less than that of the second portion 172. The radius of the first portion is suitably configured to snugly receive the stake 163 and retain it therein, while the radius of the second portion 172 is configured as a relief to receive the collar K as noted previously.

The relation of the stakes 163 and the second aperture portions 172 to the collar K and the hole J therein is best seen with reference to FIGS. 9–11. FIG. 9 shows a tray 102 in accord with the present invention in a stacking relationship with two other trays 102 shown in phantom outline. A detailed portion 174 of that Figure is shown in FIG. 10 and shown inverted in FIG. 11. To fully understand the stacking relationship and positioning of the suspensions it is now necessary to describe the obverse or bottom side of the tray 102.

Referring now to FIG. 8, it will be seen that the obverse or bottom side of the tray 102 is shown. Located inwardly of the surface 180 are a plurality of tongues 182–186 configured to mate with the grooves 144–148, respectively, when multiple trays are in a stacking relationship. Each tongue 182–186 includes an inner substantially flat surface 188 and a surrounding or encompassing side wall 190. Located inwardly of the tongues 144–148 is a sealing surface 192 that sealingly engages the O-ring 114 when the tray 102 is seated on a vacuum chamber 108, 110 such that the presently discussed side is down. This side may also contain optical fiducials 140 like those shown in FIG. 6 for the top side of the tray 102 if desired. These fiducials would preferably be located on an outer, substantially flat surface 188 that extends about the tray 102.

Like the previously discussed side of the tray 102 shown in FIG. 6, this side also has a repository 194 for holding the suspensions and may also include a number line 196 to designate positions and numbers of suspensions held thereon. It may also include row designations such as A, B, and C or some other designation as desired.

The repository 194 is configured to receive and seat a component part such as a suspension A also. It thus includes three rows 198 of base plate seats 200 having the second portion 172 extending therethrough such that it can receive the collar K as previously noted. It also includes three rows 202 of load beam seats 204 for the suspension load beam E. Load beam seats 204 include the vacuum port 166 passing through there to engage the load beam as it rests on the seat. A load beam seat 200 and a base plate seat 204 cooperate to define a component receptacle. It will be understood from viewing the various figures that the individual component receptacles within the repository 156 will align with those of repository 194 when the trays are stacked. That is, when the tray 102 is stacked onto another tray 102, the repositories 156 and 194 will be facing each other and a component receptacle in one repository will be aligned with the component receptacle in the other.

Figure 16:
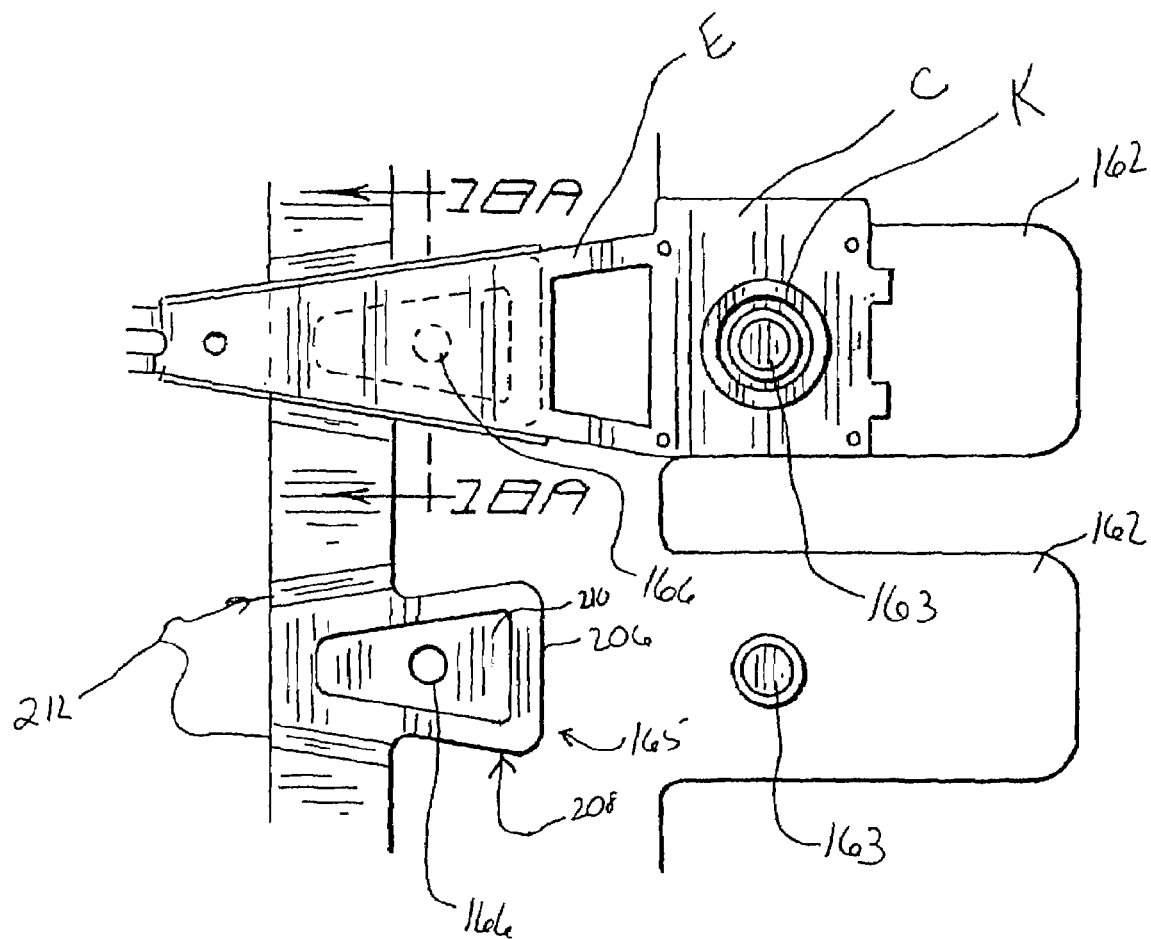
FIG. 16 is a partial top plan view of a portion of the suspension tray shown in FIG. 6 with a suspension in place with the gimbal facing down if it were shown.
Figure 18A:
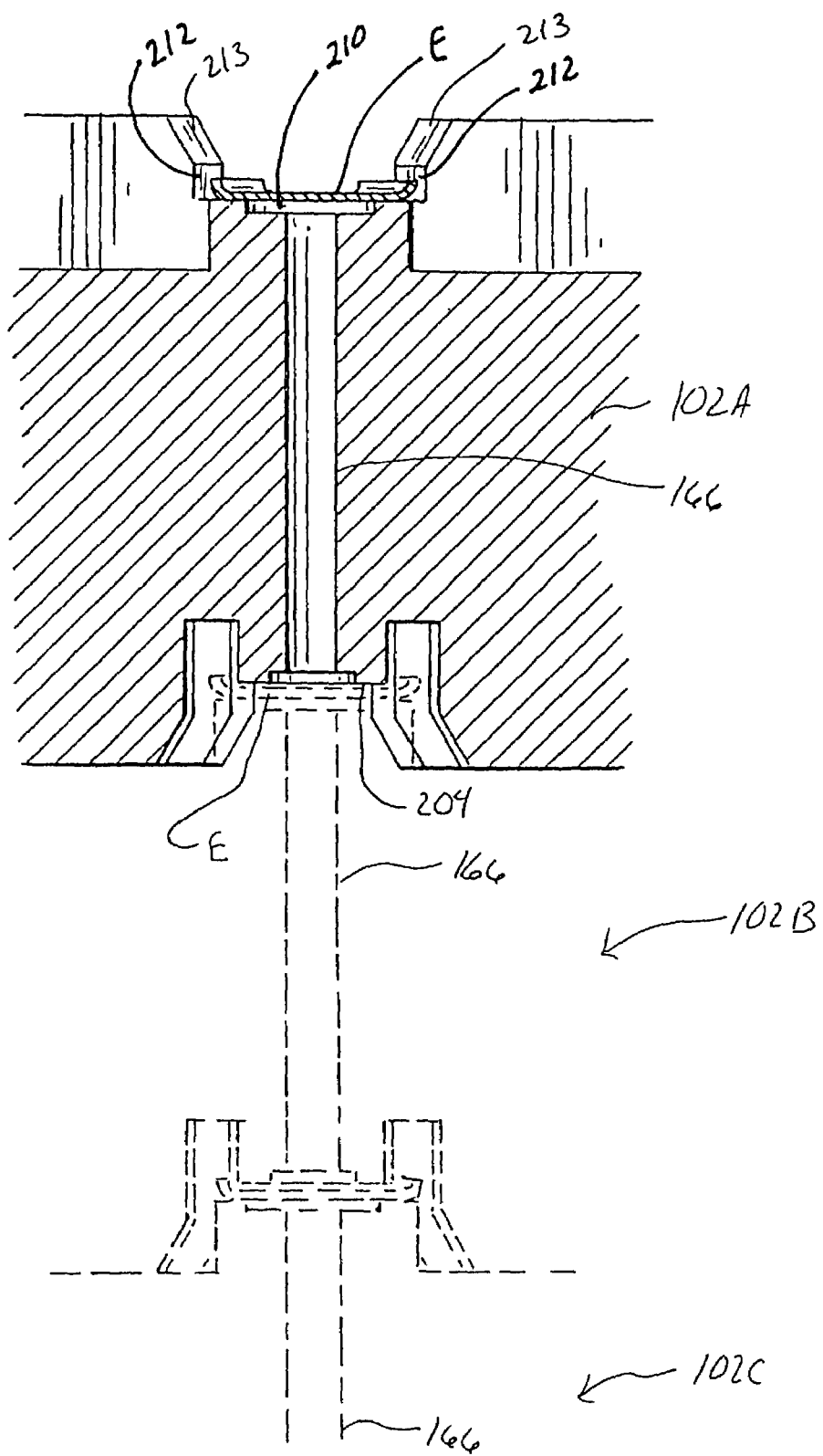
FIG. 18A is a cross section view of the tray and suspension shown in FIG. 16 taken along viewing plane 18A—18A shown in FIG. 16.

Referring now to FIGS. 10, 16 and 18A, the seating of the suspension A relative to the tray 102 and particularly the repository 156 will be discussed. As shown in the Figures, the load beam is disposed relative to the load beam seat 165 such that the gimbal is facing downwardly from the upper surface of the load beam. It will thus be observed that the base plate seat 162 has a generally elongate, rectangular configuration with the stake 163 extending upwardly therefrom. The load beam seat 165 includes a base portion 206 that supports a load beam engagement portion 208, including a recessed area 210 into which the vacuum port 166 opens forming a small vacuum chamber that engages the load beam E on the lower side as shown in the Figures. In addition, load beam seat 165 includes a pair of upwardly extending, angularly disposed sides or contacts 212 (FIG. 18A) that engage opposing side edges, that is, the opposing perimeter edges, of the load beam E.

Stated otherwise, the contacts 212 can be tapered so that the suspension A can more easily be placed between the contacts 212 yet still loosely grip the side edges. These contacts 212 are generally oriented angularly with respect to each other at the same angle as the angle of the side edges of the load beam so as to loosely engage the load beam and prevent rotation of the load beam about the stake 163. The stake 163 and the contacts 212 combine to restrain the suspension A from moving laterally. When the trays are not stacked as shown in FIG. 9, however, only gravity prevents motion in the up/down direction, consequently requiring that the unstacked trays 102 be oriented substantially horizontally to prevent spillage of the suspension A. It will be further noted that disposed upwardly of the contacts 212 are tapered or angularly disposed surfaces 213 that facilitate the seating of the suspension A on the seats 162 and 165.

When the suspension A is thus seated on the seats 162 and 165 and the tray 102 is placed upon the base 100 with the vacuum engaged, the vacuum provided by the vacuum source through the vacuum chamber 108 and thus through the vacuum ports 166, the load beam E will be held by the applied vacuum to the seats during the manufacturing operation. The seats 162 and 165 of tray 102 are configured such that the gimbal F, which is oriented downwardly in this position, of the suspension A is held in a planar orientation with respect to the vertical while the base plate C is off set relative thereto, as best seen in FIG. 10. That is, the base plate seat 162 is offset relative to the load beam engagement portion 208 to accommodate the angular difference between the two.

Figure 17:
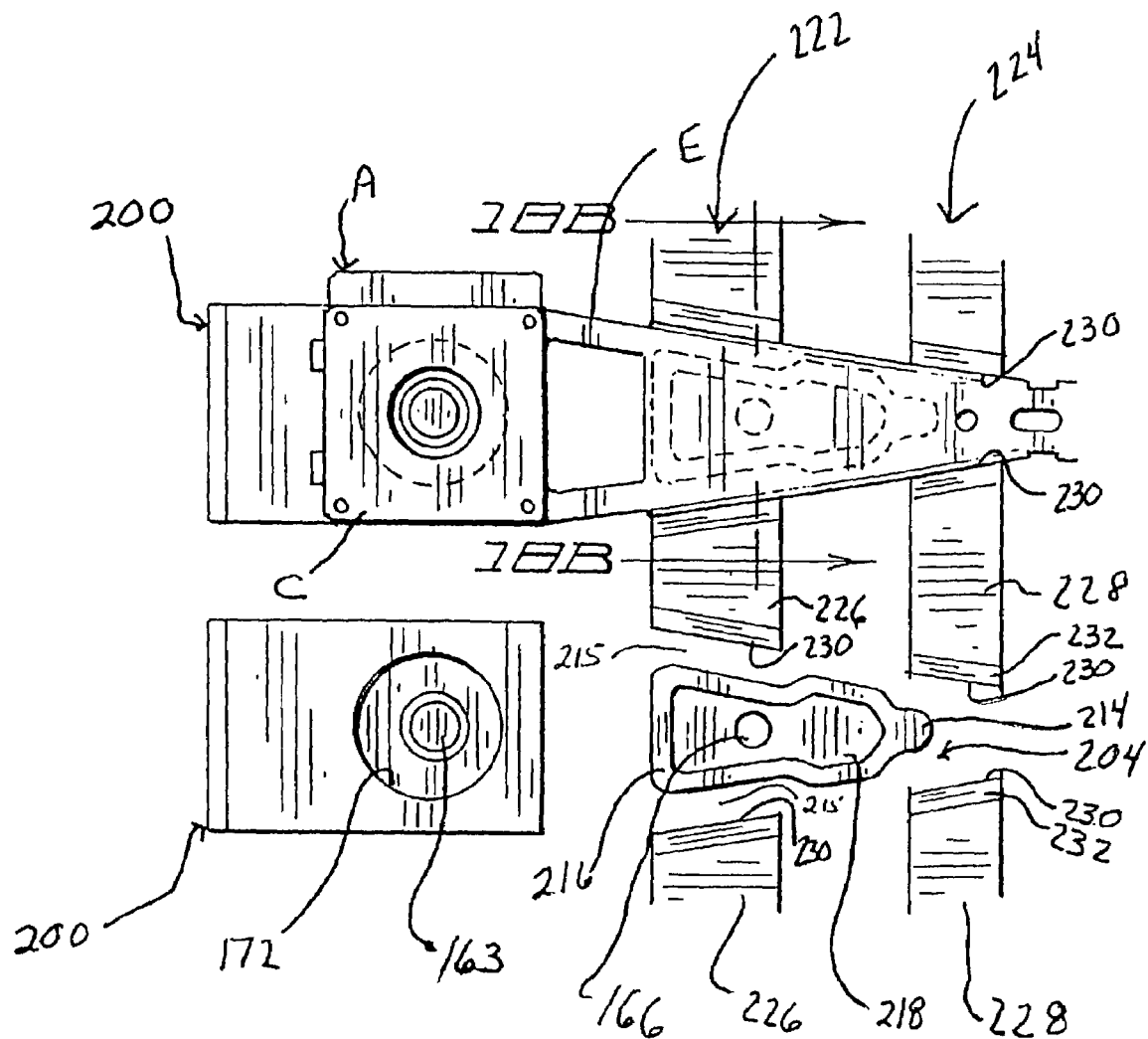
FIG. 17 is a partial top plan view of a portion of the suspension tray shown in FIG. 8 with a suspension in place with the gimbal facing up if it were shown.
Figure 18B:
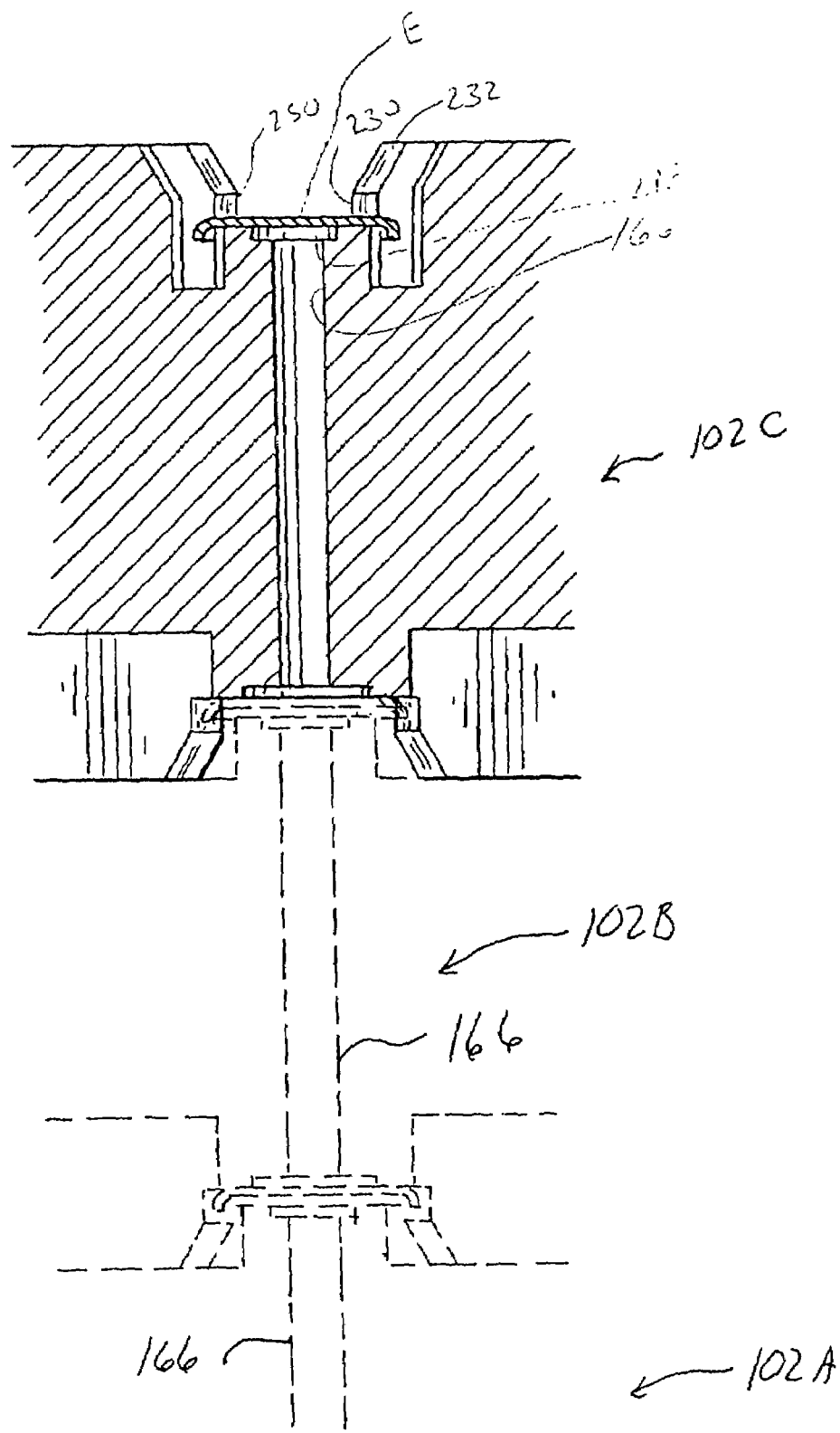
FIG. 18B is a cross section view of the tray and suspension shown in FIG. 17 taken along viewing plane 18B—18B shown in FIG. 17.
Figure 25:
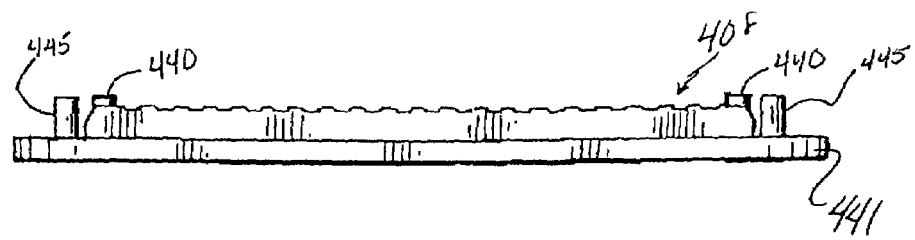
FIG. 25 shows a bottom side elevation view of the sub-tray shown in FIG. 22.

Referring now to FIGS. 11, 17 and 18B, the seating of a suspension A relative to the tray 102 and particularly the repository 194 (shown in FIG. 8) will be examined. As shown there, a suspension A is shown in place in the repository. The suspension A rests on a base plate seat 200 including the collar relief or second portion 172 which loosely receives the suspension collar K as shown, thus seating the base plate C thereon. The repository 194 further includes the previously mentioned load beam seats 204, which comprise a member 214 that is attached to the tray 102 and extends upwardly therefrom. The member 214 includes a substantially planar load beam engagement portion 216 configured to engage the load beam E and disposed within the edges thereof a recessed portion 218 into which the vacuum port 166 enters, thus forming a vacuum chamber for the load beam E.

The repository 194 further includes a restraint system 220 comprising in this embodiment a pair of spaced apart rows 222, 224 of restraint members 226, 228 respectively. The restraint members extend upward from the repository 194 and may be integral therewith. Each member includes a opposing, substantially upright oriented side surfaces 230 that engage the perimeter edges of the load beams E of suspensions A, thus restraining their lateral motion. When the trays are not stacked as shown in FIG. 9, however, only gravity prevents motion in the up/down direction, consequently requiring that the unstacked trays 102 be oriented substantially horizontally to prevent spillage of the suspension A. It will also be noted that the members 226, 228 may include angularly disposed side surfaces disposed above the surfaces 230 to facilitate proper seating of the suspensions A in the repository 194 of tray 102.

When the suspension is thus seated on the seats 200 and 204 and the tray 102 is placed upon the base 100 with the vacuum engaged, the vacuum provided by the vacuum source through the vacuum chamber 108 and thus through the vacuum ports 166, the load beam E will be held by the applied vacuum to the seats during the manufacturing operation. The seats 200 and 204 of the tray 102 are configured such that the gimbal F, which is oriented upwardly in this position, of the suspension A is held in a substantially perpendicular, planar orientation with respect to the vertical while the base plate C is angled relative thereto, as best seen in FIG. 10. That is the load beam seat 204 is substantially horizontal while the base plate seat 200 is angled relative thereto at substantially the same angle as the base plate C and load beam E are angled relative to each other.

The shipping advantages provided by the present invention can be seen by first examining FIGS. 9, 10, and 1 8A and then FIGS. 9, 11, and 18B which show stacked trays in "upright" and "inverted" orientations. Particularly referring to FIG. 1 8A, three stacked trays 1 02A, 1 02B and 1 02C capture and restrain from motion suspensions A. Focusing on the lower two trays, labeled 1 02B and 1 02C, it will be observed that each supports a suspension A from the bottom while the tray immediately above restrains the suspensions from moving vertically. Thus, in this orientation, the suspension rests on the load beam seat 165, particularly the load beam engagement portion 208, and is engaged upon its upper surface by the load beam seat 204. Additionally, as best seen in FIG. 9, the stake 163 captures the suspension A by its reception by the hole J on the bottom and the relief or second portion 172 receives and restrains the collar K of the suspension A on the top side. It will be understood therefore that the load beam seats on the "top" and "bottom" sides of the tray 102 cooperate to trap the load beam therebetween when multiple trays are stacked for shipment and the base plate seats on the "top" and "bottom" sides of the tray 102 trap the base plates therebetween.

It will be seen with respect to the Figures that the vacuum ports 166 extend from the top to bottom surfaces of the tray 102, terminating in the recessed portions 210 and 218 of load beam seats 165 and 204 respectively. Thus when the tray 102 is placed in a sealing engagement with a vacuum chamber 108 or 110 such that the O-ring seal 114 engages the sealing surface or shelf 154 or 192, depending upon the orientation of the tray. Application of a vacuum to the vacuum chambers will cause a vacuum to be applied to the suspensions A through the vacuum ports 166.

Referring now to FIGS. 12–15, the flex circuit tray 104 will be described. Tray 104 includes an outer edge surface 260 having optical fiducials 262 disposed thereon. Tray 104 also includes a plurality of grooves 264, 266, 268, and 270 arranged to form keys to keep the stacked trays oriented in the same direction. Each groove 264 includes a groove bottom 272 and an encompassing side surface 274. As shown, the bottom surface 272 is substantial planar and discontinuous with the side surface 274. It will be understood, however, that the side surface could be continuous with the bottom, forming a continuous gently curved surface.

The tray 104 includes a flex circuit repository 276. The repository 276 includes at least one row, and as shown, three rows, 278 of locating members 280, 282, respectively. The locating members are configured to position the flex circuit B, shown in phantom, at precise locations within the repository 276. Thus, adjacent pairs of members 282 are configured to engage and restrain a flex circuit, particularly the load beam portion L of the flex circuit. Adjacent pairs of the restraining members 280, meanwhile, are configured to engage and restrain the lateral motion of the interconnect portion M. Together the members 280 and 282 cooperate to restrain motion of the flex circuit B in the longitudinal direction of the flex circuit B. Advantageously, the repository 276 may include a number line 284 and row designators 286. The surface 288 of the repository 276 itself acts as the seats for the flex circuits, which have a substantially planar configuration. In addition, the surface 288 forms a sealing surface that engages the O-ring 114 of vacuum chamber 110.

Figure 14:
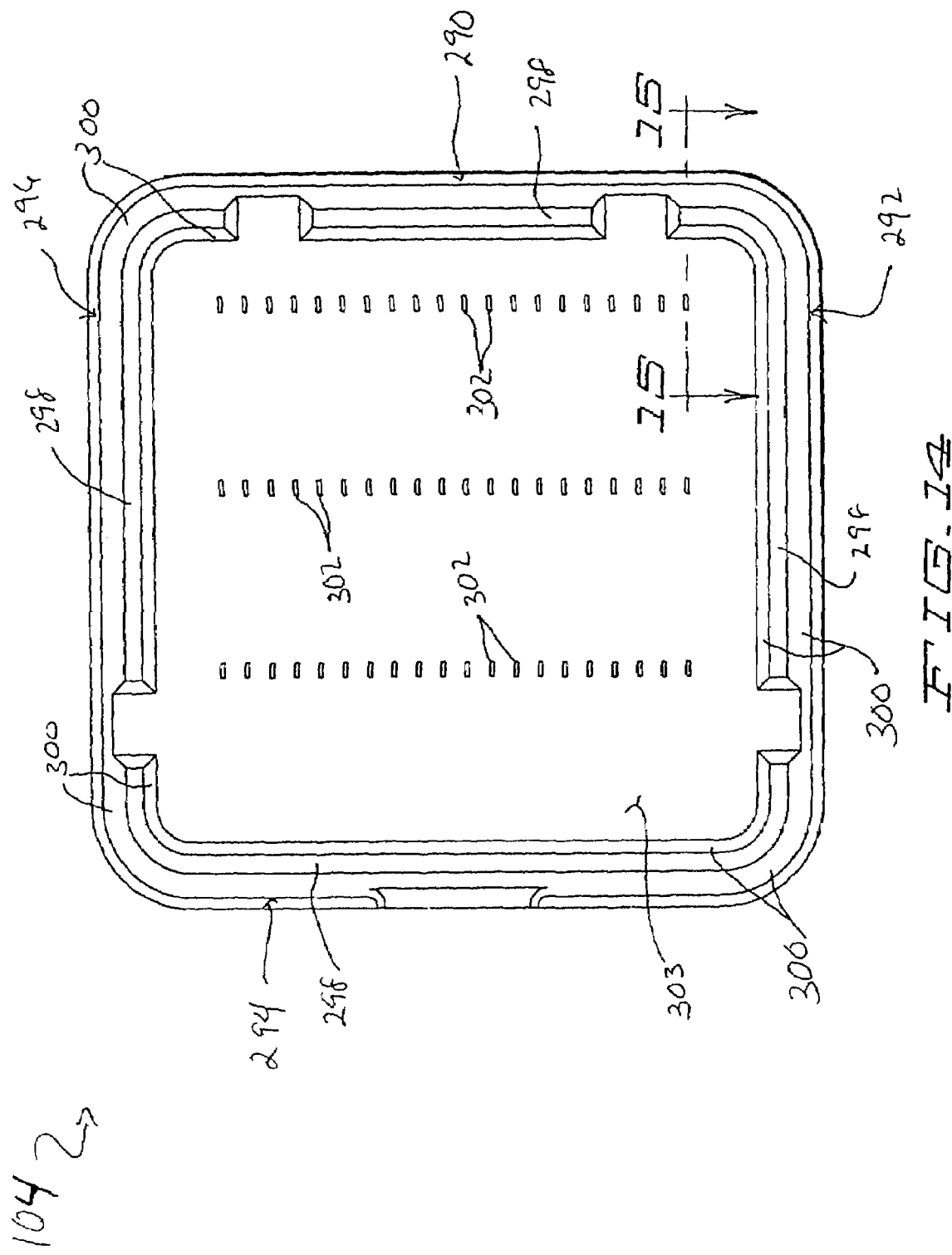
FIG. 14 is a bottom plan view of the flex circuit tray shown in FIG. 12.
Figure 15:
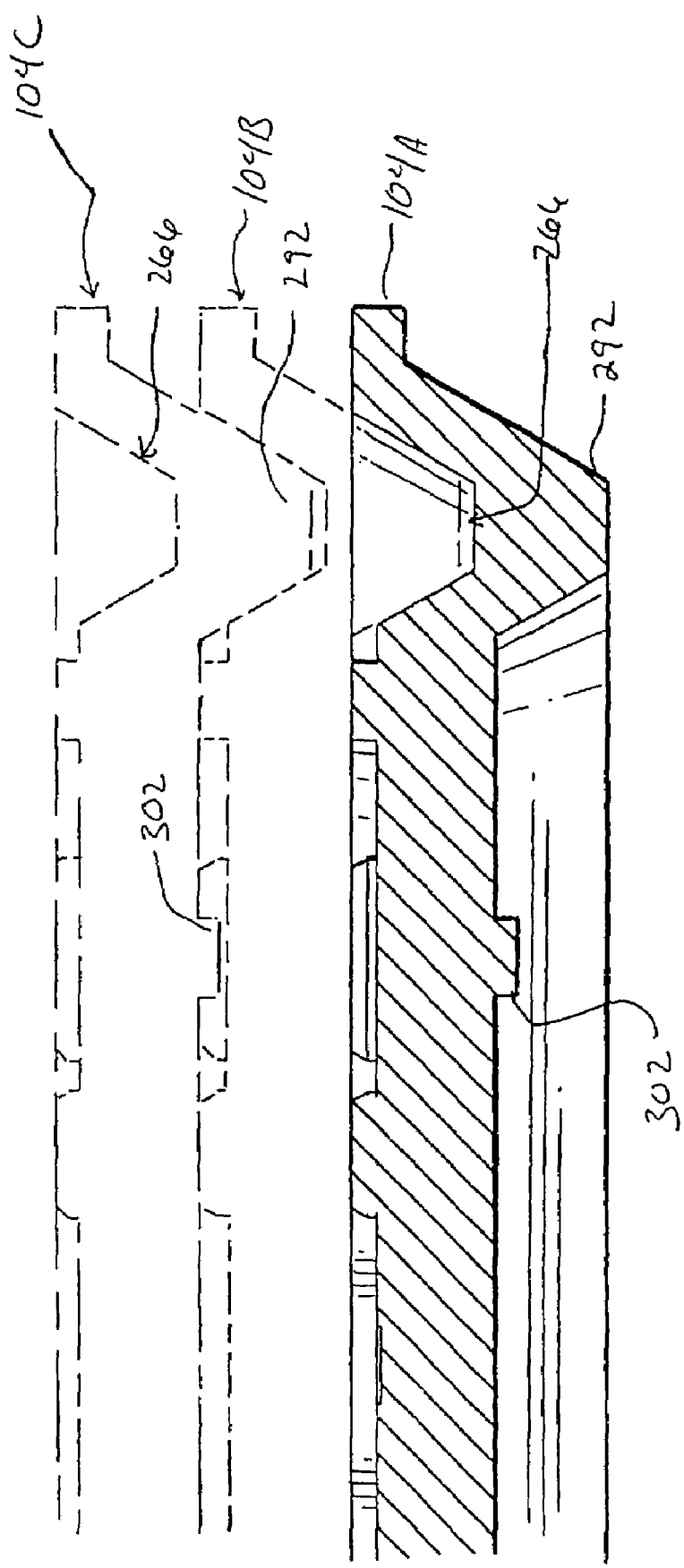
FIG. 15 is a cross section view of the flex circuit tray shown in FIG. 12 taken along viewing plane 15—15 of FIG. 14.

Referring to FIG. 14, the bottom side of the tray 104 is illustrated. The tray bottom side includes corresponding tongues 290, 292, 294, and 296 that are respectively received by grooves 264, 266, 268, and 270 when multiple trays are stacked as shown in FIG. 15. Each tongue is defined by a bottom surface 298 and a surrounding side surfaces 300.

The tray bottom side also includes a plurality of protuberances 302 that extend downwardly from the bottom surface 303 of the tray bottom side and engage the flex circuits B of the tray below when multiple trays are stacked as shown in FIG. 15. The protuberances or stops 302 thus serve to restrain motion in the vertical direction during shipment of the flex circuits. FIG. 15 illustrates three trays 104A, 104B, and 104C in a stacking relationship, showing how the tongues are received within their respective grooves and how the protuberances 302 extend downwardly relative to the restraining members 280, 282 to aid in the restraint of the flex circuits during shipment.

Reference will now be made to FIGS. 2 and 19–41 inclusive to describe an alternative embodiment 18 of a processing/shipping tray in accord with the present invention. Generally, the processing/shipping tray 18 shown in FIG. 2 includes a base 400 having a handle 402 and a pair of vacuum chambers 404, 406. Vacuum chambers 404, 406 in turn each support a sub-tray 408, 410 and a part tray 412, 414 respectively. FIGS. 19–21 illustrate the base 400 shown in FIG. 2 in a top plan view. Base 400 as shown is formed of a metal such as steel.

As shown, the base 400 includes a pair of vacuum chambers 404, 406, though it will be understood that it could include one or more in accord with the present invention, such chamber(s) taking the form of a recess or relief in the upper surface of the base 400 and being formed within the base by a known process such as machining. Each vacuum chamber 404, 406 includes an O-ring 416 disposed within a channel 418 (FIG. 21) formed in turn within a plateau 420, thus providing a pair of shoulders 422 on each side of the O-ring 416. A vacuum port 424 is substantially centrally disposed in each of the vacuum chambers. Thus, when the sub-trays 408, 410 are seated on the base 400, the O-ring 416 will engage a sealing surface on the sub-trays, allowing a vacuum to be created within the vacuum chamber by withdrawing the air through the vacuum ports 424. The O-ring 416 can be eliminated where the respective engaging surfaces of the bases and trays/sub-trays are machined to a flat enough finish such that sealing is accomplished by engagement of the surfaces alone.

The base 400 further includes a plurality of stand-offs or plateaus 426. The plateaus 426 present an upper surface or shoulder 426 at the same height as the shoulders 422 around the edge of the base and thus is useful for supporting the sub-trays and for preventing them from deforming due to the applied vacuum. The plateaus 426 also support an O-ring 430 disposed within a groove or seat 432. Centered within the plateau 426 is a counter-sunk bolt hole 434 that is useful for rigidly attaching the sub-trays thereabove to the base, as will be described later. The O-ring 430 will aid in sealing the holes 434 when the vacuum is turned on to prevent a loss thereof.

The O-rings 416 and 430 can be eliminated where the respective engaging surfaces of the base and sub-trays are machined to a flat enough finish such that sealing is accomplished by engagement of the surfaces alone. When an O-ring is used here, it is anticipated that the O-ring will compress sufficiently such that the sub-tray thereabove will come into contact with the base below so as to force the sub-tray to assume the same plane as the previously leveled base.

Finally, it will be noted that the base 400 may include a plurality of location or position pins 436 which are useful in helping to locate the tray 414 when it is placed upon the flex circuit sub-tray 410.

Figure 24:
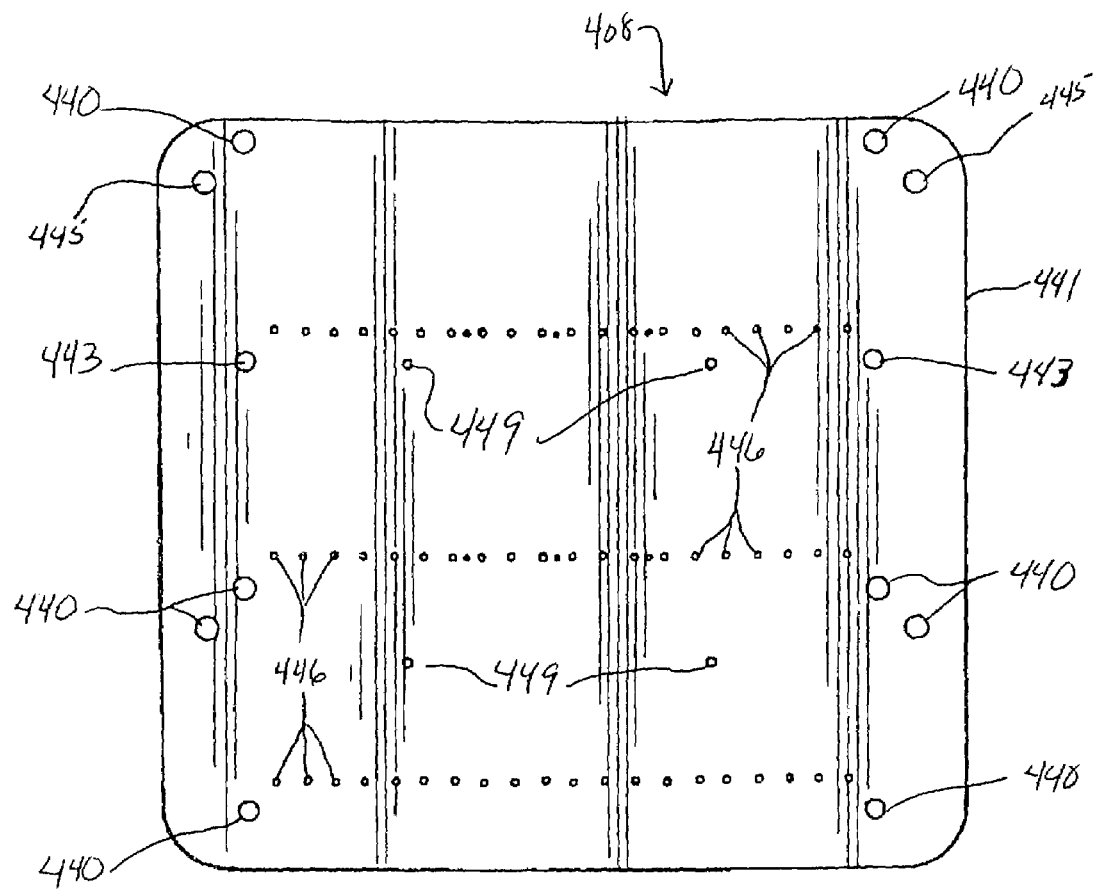
FIG. 24 illustrates the bottom surface of the sub-tray shown in FIG. 22.
Figure 26:
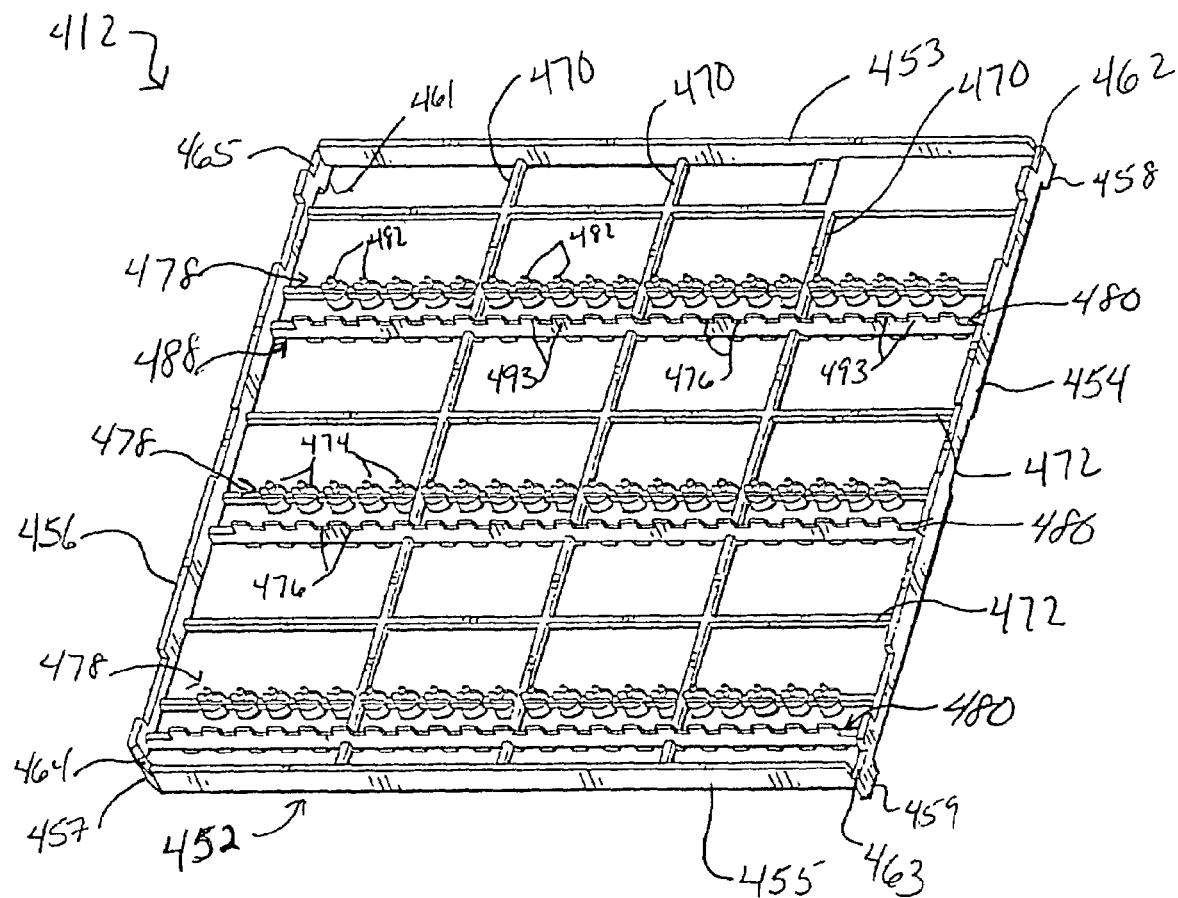
FIG. 26 shows a suspension tray of FIG. 22 in a perspective view.

The suspension sub-tray 408 and tray 412 will now be described with reference to FIGS. 22–37B. The sub-tray 408 and tray 412 cooperate to position and retain the suspensions A in proper position during assembly operations. Referring specifically to FIGS. 22–25, the suspension sub-tray 408 includes a plurality of upright positioning pins 440, beveled positioning pins 443, and fiducial pins 445 attached to a sub-tray plate 441. The positioning pins 440 are useful for correctly positioning the suspension tray 412 with respect thereto, the beveled pins 443 are useful in seating the tray 412 with respect to the sub-tray 418, and the fiducial pins 445 are useful in properly locating the sub-tray by the vision system a processing apparatus. The sub-tray 408 further includes a plurality of vacuum or load beam seats 442 arranged in rows. As seen in FIG. 22, the sub-tray 408 includes three such rows or vacuum bridges 444A–444C of vacuum or load beam seats 442, which will be described further below. As best seen in FIG. 24 the sub-tray plate 441 includes a plurality of through holes 446 that extend from the bottom surface 448 of the plate 441 through the plate and through the load beam seats 442 and a plurality of bolt tap holes 449. The through holes 446 serve as vacuum ports for the transmission of the vacuum provided through the vacuum port 424 of vacuum chamber 404 through to the vacuum or load beam seats 442, which in turn are attached to or integral with the top surface 450 of the plate 441. The bolt tap holes 449, in turn, align with the counter-sunk bolt holes 434 in the vacuum chambers 404 and 406 to enable a bolt to be threaded into the holes 434 and into the sub-tray to rigidly attach the sub-tray to the base 400.

The tray 412 is shown in FIGS. 26–31. Tray 412 preferably comprises a molded plastic item and is useful for both shipping component parts and for holding them during assembly operations. The light weight provided by use of a plastic material reduces shipping costs. It will be observed that the tray 412 includes an exterior frame 452 comprising substantially perpendicularly adjacent sides 453, 454, 455, and 456.

The frame 452 includes three substantially rectangular corners where the side 453 meets the sides 454 and 456 and where the sides 454 and 455 meet. However, a squared off corner 457 is presented where the sides 455 and 456 meet. The corner 457 thus serves as a key to prevent the trays 412 from being stacked in varying orientations from one level to the next.

Frame sides 453 and 455 have essentially planar top and bottom surfaces. The sides 454 and 456 have notched upper and lower surfaces. The side 454 includes feet 458 and 459 extending downwardly therefrom closely adjacent to where the side 454 meets side 453 and 455, respectively. A third frame foot 460 depends downwardly from corner 457 and a fourth frame foot 461 depends downwardly from the side 456 close to where it meets side 453. Disposed directly above each of the feet 458–461 are foot seats 462–465, respectively, on the upper or top surface of the sides 454 and 456 and the corner 457. The seats are formed as notches or reliefs in the top surface of the sides. Thus, when the trays 412 are stacked one upon the other the feet 458–461 will each be seated in one of the feet seats 462–465, respectively.

Desirably at least one and preferably plurality of support ribs 470 extend between sides 453 and 455. Similarly, desirably at least one and preferably plurality of support ribs 472 extend between sides 454 and 456.

The tray 412 includes a repository 473 specifically configured to seat and retain suspensions. It thus includes at least base plate seat 474 and corresponding tray load beam seat 476 which cooperate to define a component receptacle. Preferably, the tray 412 includes at least one and as shown three rows 478 of base plate seats 474 and corresponding rows 480 of load beam seats 476. The base plate seats 474 comprise an upwardly extending stake or pin 482 extending upwardly from an elongate support rib 484. The stake 482 is sized to be received within the hole K of the suspension A while the support rib 484 is configured to support the suspension along its width at the proper height. The support rib 484 and stake 482 are supported by a base plate support rib 486 that extends between sides 464 and 468 of frame 452. Rib 484 can also function to strengthen the frame 452.

Spaced from the rows of base plate support rib 486 is a load beam support rib 488, which provides the load beam seats 476. The load beam support rib 488 includes a horizontal rib surface 490 and a vertical portion 492. The vertical rib portion 492 includes the load beam seats 476, which are presented as a plurality of reliefs in the top surface 494 of the vertical rib portion 492, thus providing a plurality of upwardly extending tabs 495. The load beam seats 476 are configured such that each can receive and support the gimbal end of the load beam E of a suspension A. Furthermore, each load beam seat 476 is configured such that opposing sides 496 of the relief engage the perimeter edges of the load beam E and restrain its lateral motion.

Figure 35:
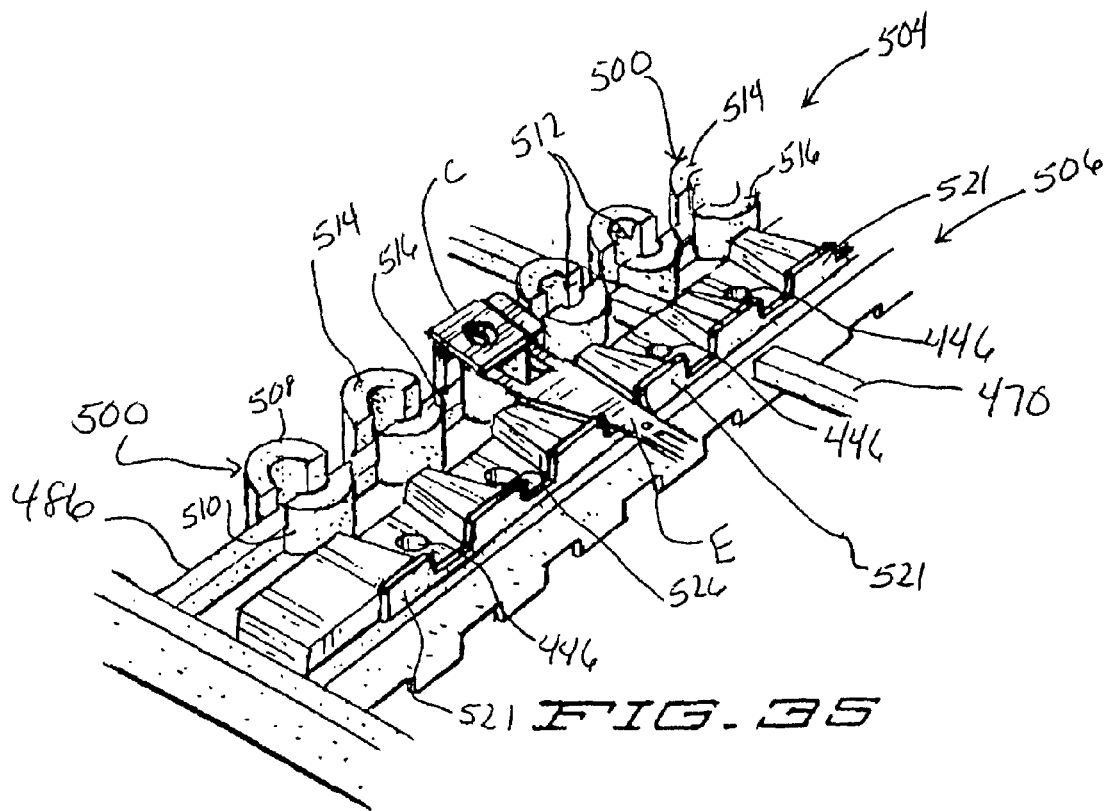
FIG. 35 illustrates in a perspective detail view a portion of the sub-tray and tray shown in FIG. 22 and further illustrates the cooperation of the sub-tray and tray shown in FIG. 22 when the tray is inverted from the position in shown in FIG. 22 such that the suspensions are held in place by the bottom side.
Figure 36:
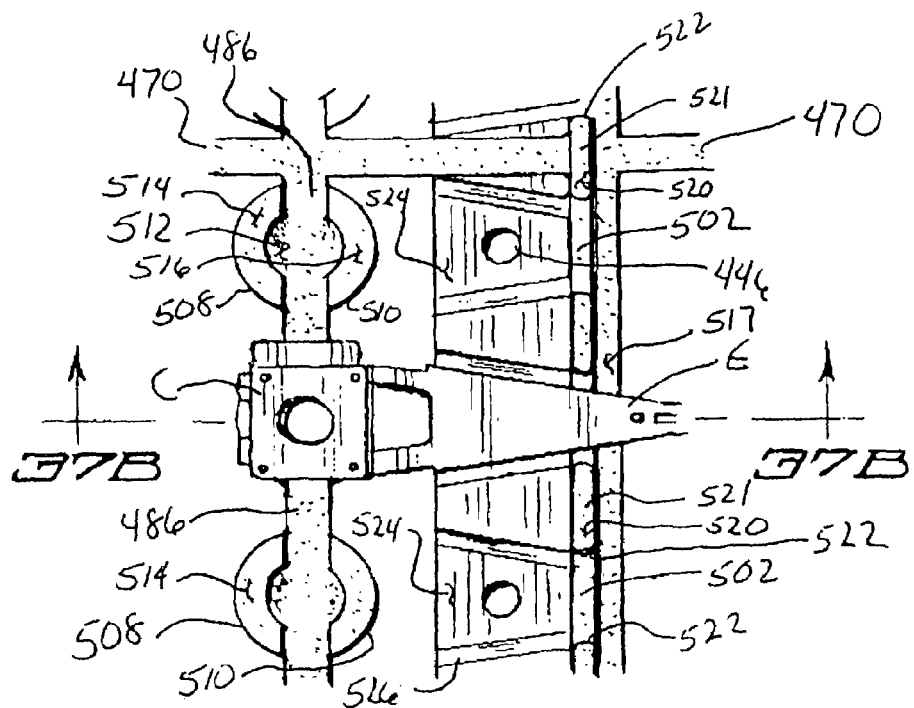
FIG. 36 shows in a top plan, detail view the cooperation of the sub-tray and tray when the tray is in the inverted position.

Referring to FIGS. 30, 35, and 36, the "bottom" or inverted side of the tray 412 will now be described. The inverted side of the tray 412 includes a repository 499 for components, manifested as at least one base plate collar seat 500 and a corresponding load beam seat 502 which cooperate to define a component receptacle. As shown in the figures, the tray 412 includes a plurality of such base plate collar seats 500 arranged in linear rows 504 and a corresponding plurality of load beam seats 502 arranged in linear rows 506. The base plate collar seats 500 each comprise a pair of opposed semi-cylindrical members 508, 510 defining a base plate collar relief aperture 512. The aperture 512 is sized and shaped to receive the collar K of the suspension A as seen in FIG. 36. The members 508 and 510 respectively define support surfaces 514 and 516 upon which the suspension A rests.

As with the previously discussed side of the tray 412, spaced from the rows of base plate support rib 486 is the load beam support rib 488, which provides the load beam seats 502. The load beam Support rib 488 includes a horizontal rib surface 517 and a vertical rib portion 518. The vertical rib portion 518 includes the load beam seats 502, which are presented as a plurality of reliefs in the top surface 520 of the vertical rib portion 492, thus providing a plurality of upwardly extending tabs 521. The load beam seats are configured such that each can receive and support the gimbal end of the load beam E of a suspension A. Furthermore, each load beam seat 502 is configured such that opposing sides 522 of the relief engage the perimeter edges of the load beam E and restrain its lateral motion.

Figure 28:
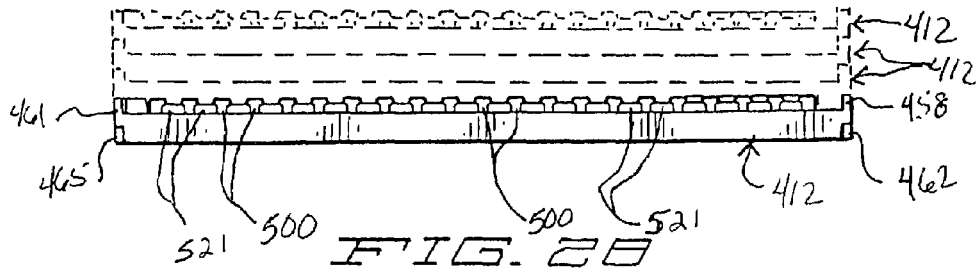
FIG. 28 illustrates the suspension tray of FIG. 22 in a side elevation view with additional suspension trays shown in phantom detail stacked thereupon.
Figure 27:
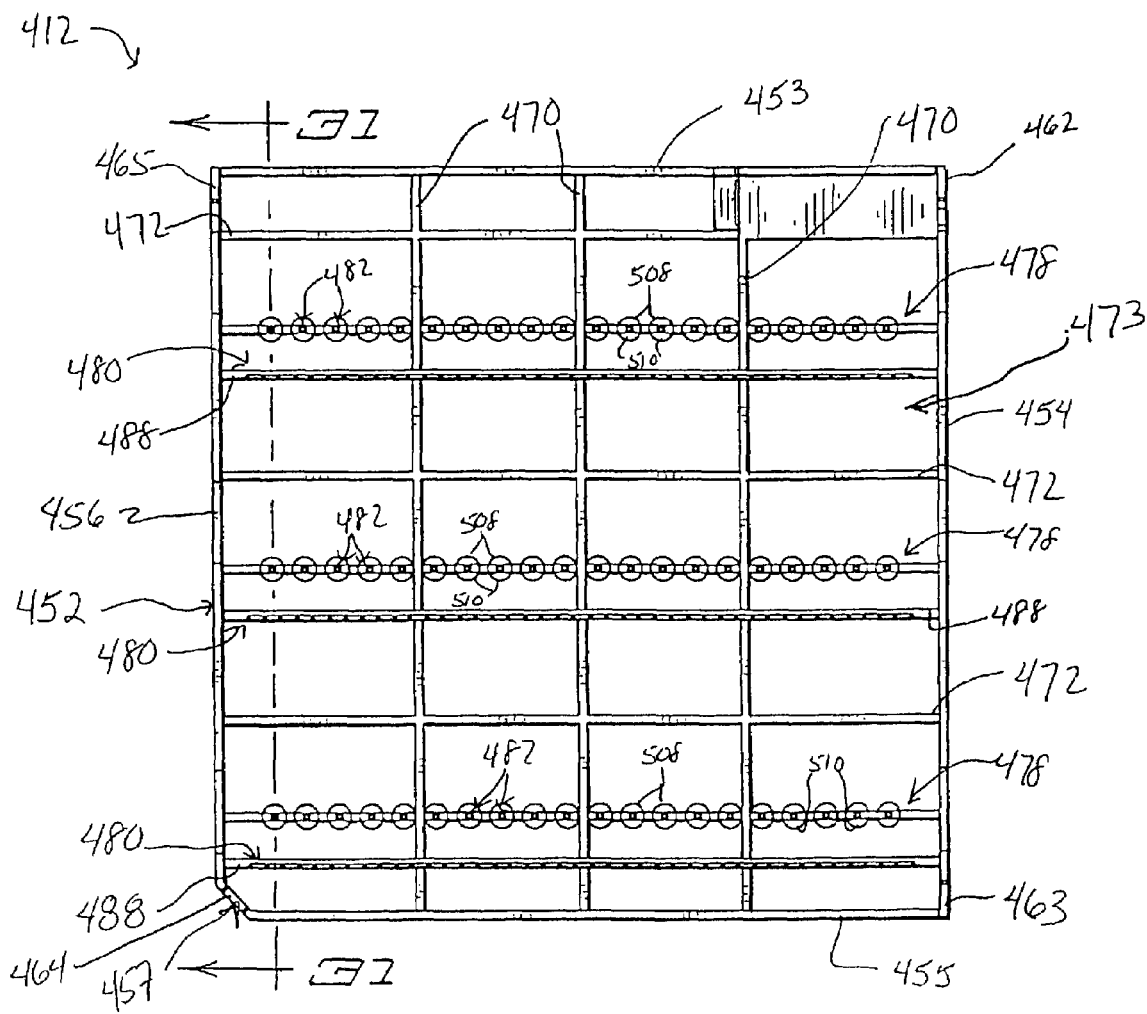
FIG. 27 depicts suspension tray of FIG. 22 in a top plan view.
Figure 33:
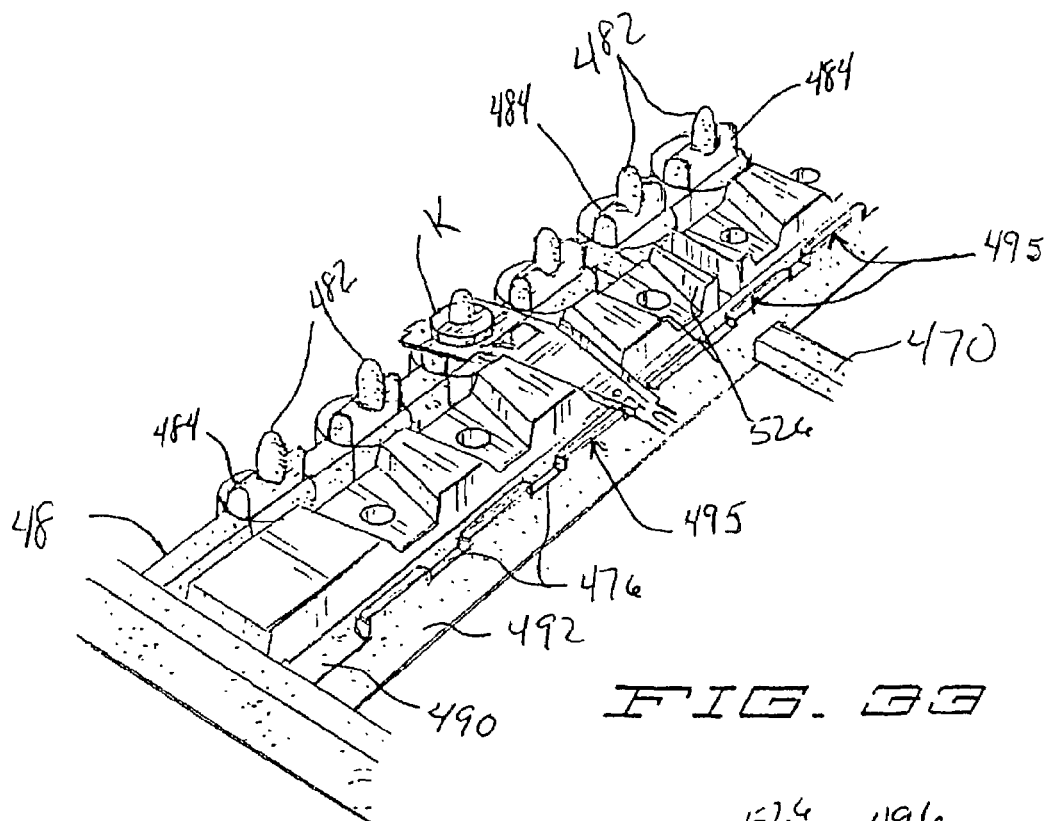
FIG. 33 is a perspective detail view of a portion of the sub-tray and tray shown in FIG. 22.
Figure 34:
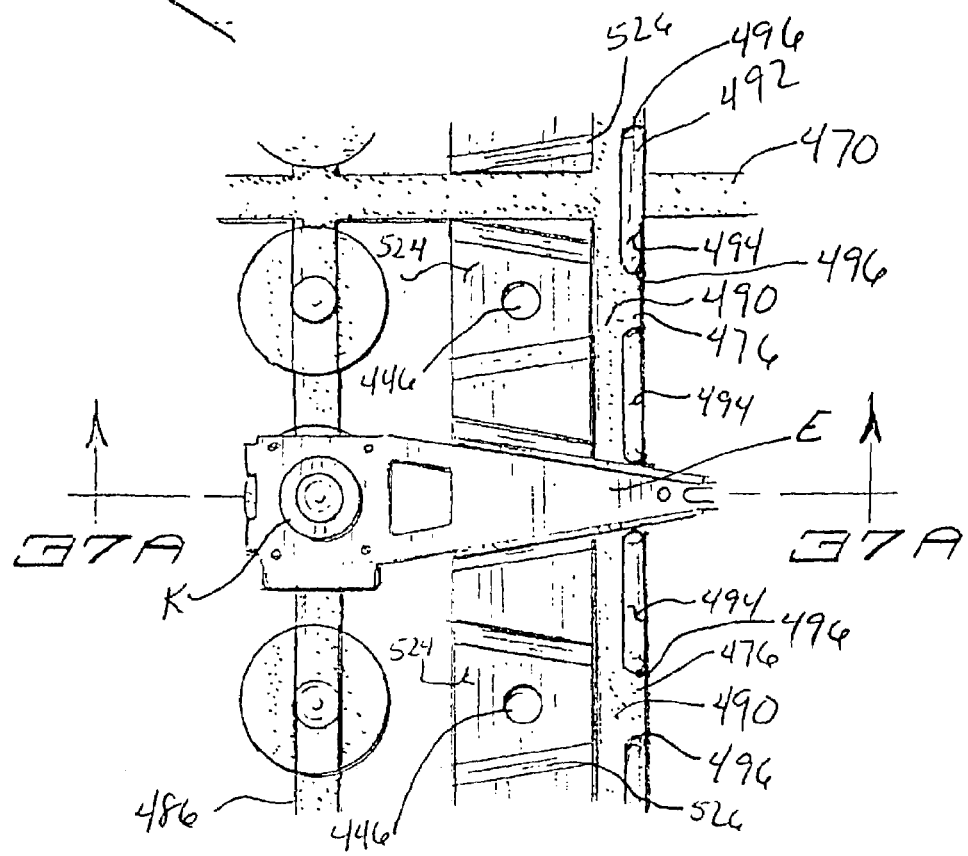
FIG. 34 is a top plan detail view of a portion of the sub-tray and tray shown in FIG. 22.
Figure 37A:
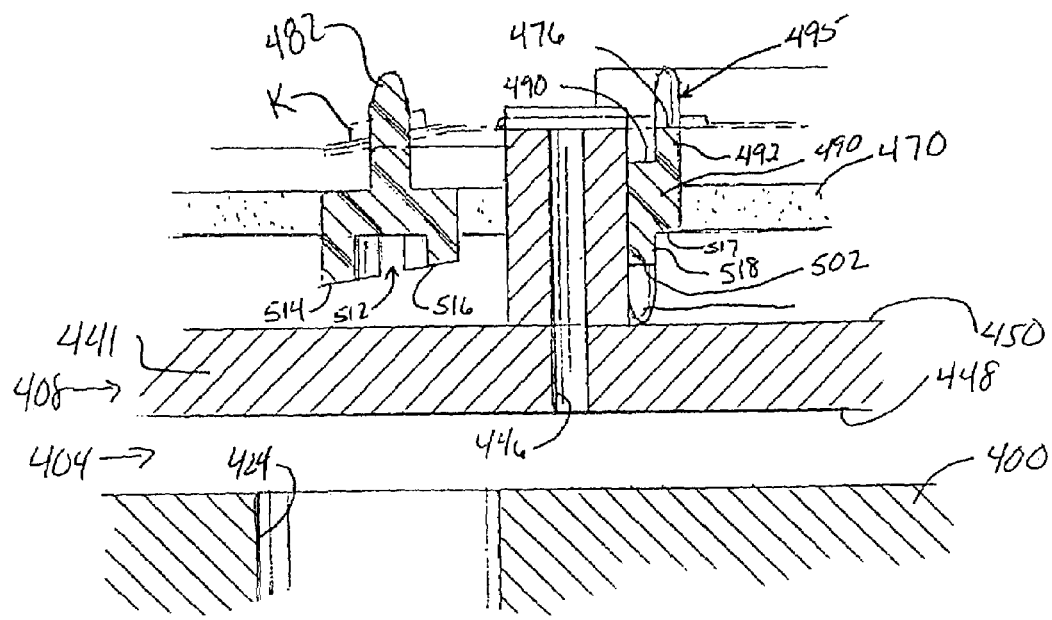
FIG. 37A illustrates in a cross section view the sub-tray and tray along viewing plane 37A—37A of FIG. 34.
Figure 37B:
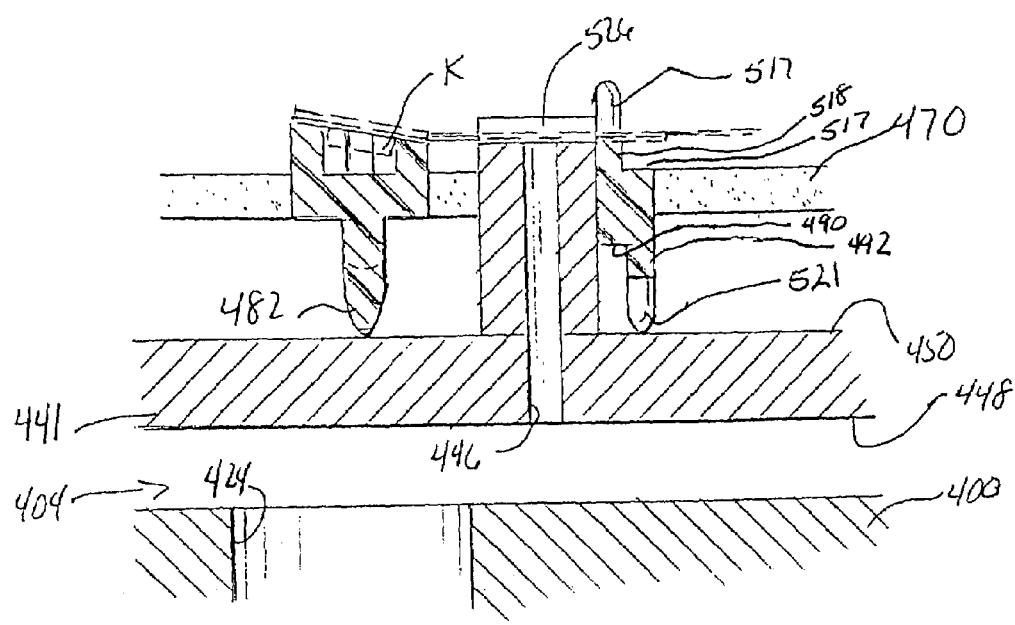
FIG. 37B illustrates in a cross section view the sub-tray and inverted tray along viewing plane 37B—37B of FIG. 34.
Figure 38:
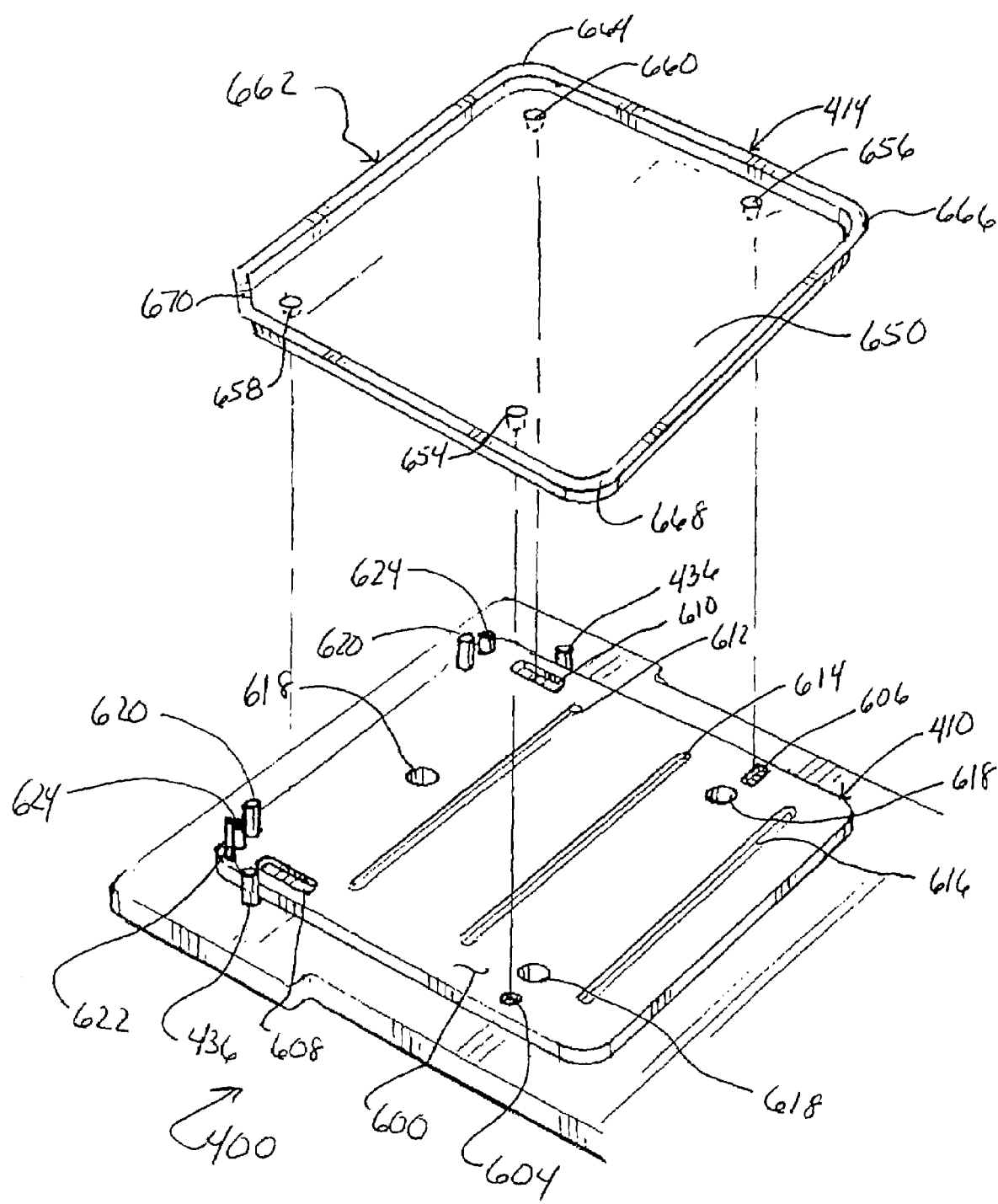
FIG. 38 illustrates the sub-tray and flex circuit tray useful for positioning flex circuits during assembly operations.
Figure 41:
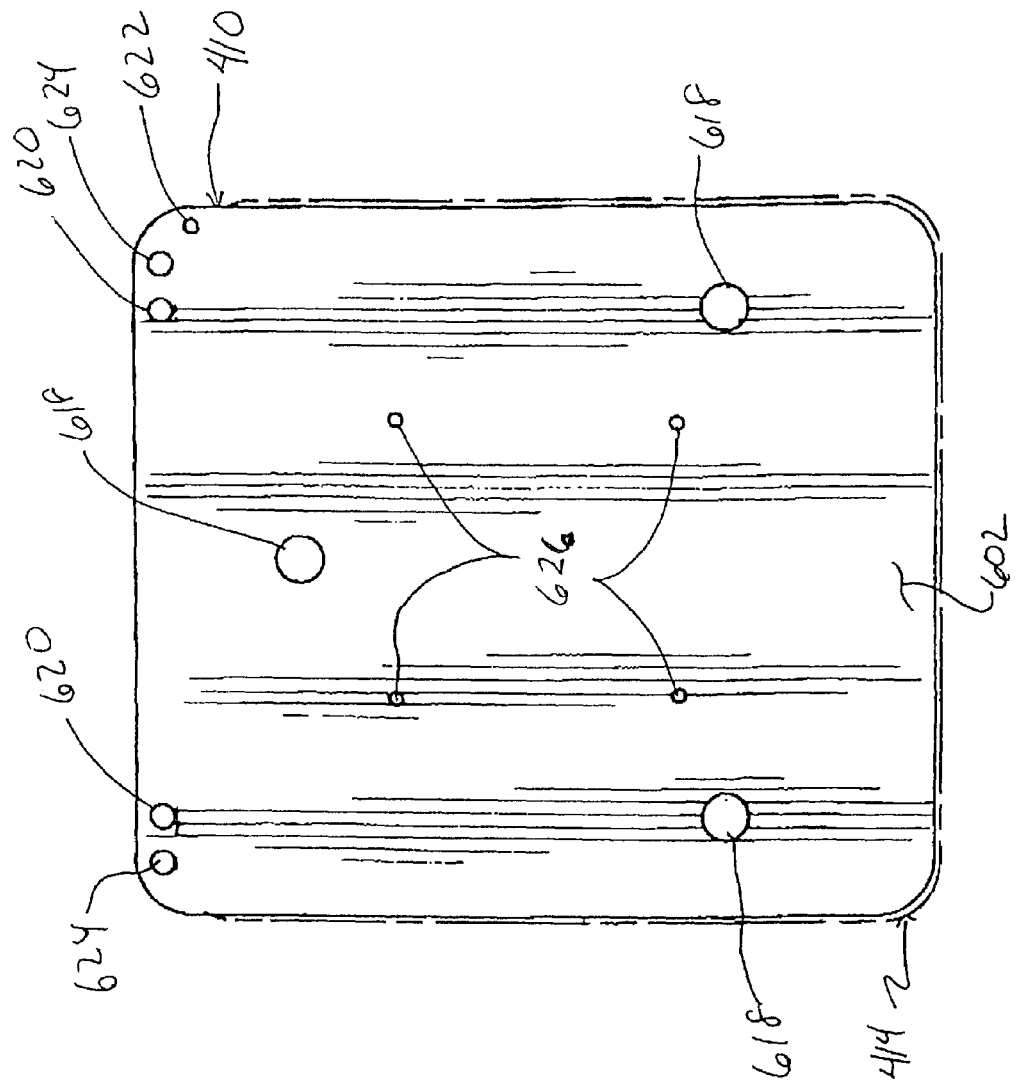
FIG. 41 shows the flex circuit sub-tray in a bottom plan view.

When the trays 412 are stacked one upon the other as seen in FIGS. 28 and 32, the feet 458–461 will each be seated in one of the feet seats 462–465, respectively, as previously noted. The repositories 473 and 499 of adjacent stacked trays will face each other and the component receptacles in one repository will align with those in the facing receptacle. The stakes 482 will be received within the collar aperture 512. Thus, when suspensions are loaded into the trays, the suspension will be held in place with the stake extending through the collar K into the collar aperture 512 and the collar K being at least partially received therein. The load beam support rib 488 as shown includes horizontal rib portions or surfaces 490 and 517. These surfaces, like the tabs 495 and 521 are offset with each other such that when the trays are stacked, the tabs 495 will be seated on the horizontal rib surface 517 and the tabs 521 will be seated on the horizontal rip surface 490 as best seen in FIGS. 32, 37A and 37B. Suspensions will be held between the respective load beam seats 476 and 502.

To fully understand the cooperative nature of the sub-tray 408 and the tray 410 during assembly operations, reference is made to FIGS. 33–37B. It will first be necessary to describe the load beam seats 442 presented by the sub-tray 14. Load beam seats 442 are formed in the upper surface of the member forming the rows 444A–444C. Each of the seats is formed as a relief in the upper surface and includes a substantially planar load beam rest surface 524. The rest surface 524 has a wedge-shaped configuration to match the triangular configuration of the load beam E of the suspension A. The through holes 446, as seen in FIGS. 37A and 37B extend through the row member 444 and the sub-tray plate 441 into a fluid communication with the vacuum chamber 404. Application of a vacuum to the vacuum chamber will result in the vacuum being transmitted to the through holes 446, thus holding the load beam in place on the rest surface 524. It will also be noted that the seats 442 include a pair of angularly disposed side walls 526 that engage the perimeter edges of the load beam E.

To place the tray 412 onto the sub-tray 408 the user will grasp the tray 412 by the sides and will position the tray relative to the sub-tray such that the frame side 453 is disposed substantially adjacent the location pins 440 and the vacuum bridge 444A and such that the row 480 (or row 506, if the tray is inverted) is placed on or nearly on the beveled positioning pins 443. The tray will continue to be lowered and moved forward by the interference between the beveled positioning pins 443 and the load beam seat row 480 (or 506). Finally, the tray 412 will drop into position such that each row 480 of load beam seats on the tray 412 lies closely adjacent to a vacuum bridge 444A, 444B, or 444C, as best seen in FIGS. 33–36 with the vacuum bridge lying between the row of load beam seats and the row of base plate seats.

Referring now to FIGS. 38–41, the flex circuit sub-tray 410 and tray 414 will now be described. The flex circuit sub-tray 410 has a substantially planar top and bottom surfaces 600, 602, respectively. The bottom surface 602 will be engaged by the O-ring 416, thus creating a seal between the vacuum chamber 406 and the sub-tray 410 and holding it in place. The top surface includes appropriate reliefs which cooperate with the tray 414 to precisely locate the tray relative thereto. Thus the top surface 600 includes a circular recesses 604, an oval recess 606, and a pair of elongate recesses 608, 610. The top surface 600 also includes at least one and as shown a plurality of elongated recesses 612, 614, and 616.

A plurality of through holes 61 8 are provided that extend through the sub-tray 410, thus providing access to the vacuum chamber 406. Because the flex circuit tray 414 is preferably formed of a thermoplastic material, it is desired to maintain it flat, thus keeping the flex circuits at the same relative height. Thus, the applied vacuum will act on the flex circuit tray 414 and not on the parts themselves, unlike the suspensions. In this manner then, the vacuum collet of the apparatus 10 will not have to fight the vacuum when lifting and moving the flex circuits from the tray 414 to an assembly position over the suspensions held in the tray 412. In addition, because the flex circuits are being picked from that tray, there is no need to hold them still like there is the suspensions.

The sub-tray 410 further advantageously includes a plurality of stop pins 620, locator key pin 622 and fiducial pins 624. The stop pins 620 are useful in seating the tray 414 on the sub-tray 410 as is the locator key pin 622. The fiducial pins are used by the imaging system of the apparatus 10 to precisely locate the sub-tray and tray.

The sub-tray also includes a plurality of tap holes 626 that may receive bolts from the counter-sunk threaded holes 434 in the base 400.

The tray 414 is shown in generic form. Tray 414 holds the flex circuits and thus can be similarly configured as the previously discussed trays as far as the means to engage and retain the flex circuits goes. Thus the tray 414 will include the necessary engagement surfaces on the upper surface 650. Tray 414 will also include the appropriate number of elongate protuberances or engagement members 652 disposed on the bottom surface. The protuberance 652 will engage the flex circuits from above when stacked for shipping to retain the flex circuits in position therein and when placed on the sub-tray 410 will be received by the recesses 612, 614, and 616. The tray 414 also includes four legs 654–660 that will be received within the recesses 604–610 respectively. The recess 604 is used to precisely locate the tray, while the recess 606 prevents rotation thereof about the recess 604. The other recesses 608, 610 provide the necessary relief to accommodate engineering tolerances.

Tray 414 includes a bottom defined by the top surface 650, an encircling, substantially upright outer wall 661 and a substantially horizontal, encircling lip 662. Tray 414 includes four corners 664, 666, 668, and 670. Corner 670 is straight and not rounded and serves a locator function to ensure that the tray 414 is correctly positioned on the sub-tray 410 in the manner to be hereafter described.

When it is desired to seat the tray 414 onto the sub-tray 410 the operator will orient the tray 414 such that the feet 658 and 660 are received within the elongated recesses 608, 610 respectively, and then slid within the recesses forward. The locator pins 436 will help keep the tray 414 properly aligned as the tray is slid forward until the tray lip 662 encounters the stop pins 620. At that time the feet 654 and 656 will seat within the recesses 604 and 606 respectively. The configuration of corner 670 will prevent the tray from being inserted improperly because if there is an attempt to insert the tray in other manner other than that just described, the key locator pin 622 will interfere with the corner, be it 664, 666, or 668, and thus will prevent the operator from sliding the tray forward into substantial engagement with the stop pins and will prevent the feet from seating within the recesses 604 and 606.

The component trays described herein are preferably injection molded, but they could also be machined, vacuum formed, molded or cast, stamped, or made with stereo lithography. The trays can also be fabricated from a conductive material so as to minimize ESD damage to ESDS components if desired.

Having completed the general description of the processing assemblies 16 and 18, their operational use will now be described. First, head suspension assemblies will be located into the suspension trays and flex circuits will be loaded into the flex circuit trays. When the trays are fully loaded, they will be stacked for shipment. Typically, an empty tray will be placed on top of the last full tray and the stack will then be packaged for shipment. In the manner heretofore described with respect to each embodiment tray embodiment the stacking of the trays will cause the component parts held therein to be restrained in motion by the cooperative action of the tray above and the tray below the parts.

At the manufacturer the trays will typically be oriented such that the trays including the suspensions are oriented with the gimbal up and the trays will be unstacked and are ready to be inserted into the manufacturing process of the particular manufacturer. The trays will be placed upon the sub-tray or base depending upon the particular embodiment and the vacuum will be applied to the tray, holding the suspensions in place or the tray of flex circuits. The assembly apparatus can now be used to locate a flex circuit, pick it up with the vacuum collet, position it relative to the suspension for attachment, dispense adhesive onto the suspension, and lower the flex circuit into an adhesive engagement with the suspension. If desired the adhesive can be quick-cured with ultra-violet light. The process of assembling a flex circuit to a suspension can be repeated until all of the flex circuits have been adhered to a suspension. The completed tray can then be removed from the apparatus 10 for a final oven curing of the adhesive.

It will be understood that the present invention is not limited to the precise suspension structure shown in the Figures nor is it limited to the hard disk drive industry or computer related industries generally.

It will be understood that the present invention has been described with respect to a particular component part. Thus, it will be understood also that the present invention has broader use and that the component receptacles described herein could be configured to receive other component parts and that the vacuum seats 442 would also be configured to receive and hold those other component parts. It will further be understood by those skilled in the art that the shapes of the trays are dictated in part by the component configurations, the number of parts to be held by each tray, and the processing apparatus that will use the trays.

It will also be understood that the present invention contemplates that one of the component receptacles could be recessed within the surface of the component trays and that the other side would consequently include component receptacles or engaging protuberances of sufficient height to restrain the motion of the component within the recess or cavity. Additionally, the processing assembly disclosed and described herein could be used where identical parts are to be assembled together or where the parts are different and that more than two vacuum chambers and trays could be used in accord with the present invention.

The present invention having thus been described, other modifications, alterations, or substitutions may now suggest themselves to those skilled in the art, all of which are within the spirit and scope of the present invention. It is therefore intended that the present invention be limited only by the scope of the attached claims below.

What is claimed is:

1. A tray system for holding and positioning head suspensions as components, the tray system comprising:
   a first tray comprising a first side having at least one component receptacle and an opposite second side having at least one component receptacle, wherein at least one of the component receptacles of the first side of the first tray comprises a base plate seat positioned adjacent a first load beam seat, and at least one of the component receptacles of the second side of the first tray comprises a base plate collar seat adjacent a second load beam seat; and a second tray engageable with the first tray, the second tray comprising a first side having at least one component receptacle and an opposite second side having at least one component receptacle, wherein at least one of the component receptacles of the first side of the second tray comprises a base plate seat positioned adjacent a first load beam seat, and at least one of the component receptacles of the second side of the second tray comprises a base plate collar seat adjacent a second load beam seat, wherein the second side of the first tray is adjacent the first side of the second tray so that the at least one component receptacle of the first side of the second tray is substantially aligned with the at least one component receptacle of the second side of the first tray for cooperatively restraining the motion of at least one component, of the components, positioned therein.

2. The tray system of claim 1, wherein at least one of the base plate seats of the second tray includes a component engaging protuberance, wherein the protuberance is engageable with the base plate collar seat of the adjacent first tray.

3. The tray system of claim 1, wherein at least one of the base plate collar seats of the first tray includes a component engaging recess, wherein the recess is engageable with the base plate seat of the adjacent second tray.

4. The tray system of claim 1, wherein the first load beam seat further comprises at least one upwardly extending portion for laterally restraining a component positioned thereon.

5. The tray system of claim 1, wherein the base plate collar seat further comprises a collar relief aperture for receiving a collar portion of a component.

6. The tray system of claim 1, wherein the second load beam seat further comprises at least one upwardly extending portion for laterally restraining a component positioned thereon.

7. The tray system of claim 1, wherein the first load beam seat further comprises at least one opening extending from the first side of the first tray to the second side of the first tray.

8. The tray system of claim 1 in combination with at least one component.

9. The tray system of claim 1, wherein the first tray and second tray are identical.

10. The tray system of claim 1, further comprising at least one opening extending from the component receptacle on the first side of the first tray to the component receptacle on the second side of the first tray.

11. presented)The tray system of claim 10, further comprising a vacuum chamber in fluid communication with the opening of the first tray.

* * * * *